(12) United States Patent
Kerness et al.

(10) Patent No.: US 9,224,890 B1
(45) Date of Patent: Dec. 29, 2015

(54) LIGHT SENSOR HAVING TRANSPARENT SUBSTRATE WITH LENS FORMED THEREIN

(71) Applicant: Maxim Integrated Products, Inc., San Jose, CA (US)

(72) Inventors: Nicole D. Kerness, Menlo Park, CA (US); Arkadii V. Samoilov, Saratoga, CA (US); Zhihai Wang, Sunnyvale, CA (US); Joy T. Jones, Fremont, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 14/328,957

(22) Filed: Jul. 11, 2014

Related U.S. Application Data

(62) Division of application No. 13/337,879, filed on Dec. 27, 2011, now Pat. No. 8,779,540.

(60) Provisional application No. 61/436,507, filed on Jan. 26, 2011, provisional application No. 61/490,568, filed on May 26, 2011, provisional application No. 61/491,805, filed on May 31, 2011.

(51) Int. Cl.
*H01L 31/0232* (2014.01)
*H01L 31/18* (2006.01)
*H01L 31/0216* (2014.01)
*H01L 27/146* (2006.01)

(52) U.S. Cl.
CPC .... *H01L 31/02327* (2013.01); *H01L 27/14621* (2013.01); *H01L 27/14643* (2013.01); *H01L 27/14687* (2013.01); *H01L 31/02165* (2013.01); *H01L 31/18* (2013.01)

(58) Field of Classification Search
CPC .................. H01L 31/02165; H01L 27/14685; H01L 27/14621; H01L 27/14643; H01L 27/14618; H01L 27/14625; H01L 27/14687; H01L 27/14636
See application file for complete search history.

(56) References Cited

U.S. PATENT DOCUMENTS 8,598,672 B2    12/2013    Wang et al.
8,624,341 B2    1/2014    Holenarsipur et al.
(Continued)

FOREIGN PATENT DOCUMENTS

| CN | 101335284 A | 12/2008 |
|---|---|---|
| JP | 200860320 | 3/2008 |
| WO | 2008081950 | 7/2008 |

OTHER PUBLICATIONS

Pending U.S. Appl. No. 14/341,883, filed Jul. 28, 2014.
(Continued)

*Primary Examiner* — A. Sefer
(74) *Attorney, Agent, or Firm* — Advent, LLP

(57) ABSTRACT

Light sensor devices are described that have a glass substrate, which includes a lens to focus light over a wide variety of angles, bonded to the light sensor device. In one or more implementations, the light sensor devices include a substrate having a photodetector formed therein. The photodetector is capable of detecting light and providing a signal in response thereto. The sensors also include one or more color filters disposed over the photodetector. The color filters are configured to pass light in a limited spectrum of wavelengths to the photodetector. A glass substrate is disposed over the substrate and includes a lens that is configured to collimate light incident on the lens and to pass the collimated light to the color filter.

16 Claims, 31 Drawing Sheets

(56) References Cited

U.S. PATENT DOCUMENTS

| | | |
|---|---|---|
| 8,749,007 B1 | 6/2014 | Kerness et al. |
| 8,779,540 B2 | 7/2014 | Kerness et al. |
| 8,791,404 B2 | 7/2014 | Kerness et al. |
| 8,803,068 B2 | 8/2014 | Kerness et al. |
| 2006/0024505 A1 | 2/2006 | Keh et al. |
| 2006/0049412 A1 | 3/2006 | Cho |
| 2008/0105939 A1 | 5/2008 | Keh et al. |
| 2009/0147101 A1 | 6/2009 | Tatani et al. |
| 2009/0206432 A1* | 8/2009 | Kim et al. .................... 257/432 |
| 2011/0032398 A1 | 2/2011 | Lenchenkov |
| 2011/0122303 A1 | 5/2011 | Bonkohara |
| 2012/0170284 A1 | 7/2012 | Shedletsky |

OTHER PUBLICATIONS

Pending U.S. Appl. No. 14/299,117, filed Jun. 9, 2014.
Official Action dated Jun. 17, 2015 for Chinese Patent Application No. 201210025792.9.
Official Action dated Jun. 30, 2015 for Chinese Patent Application No. 201210025794.8.

\* cited by examiner

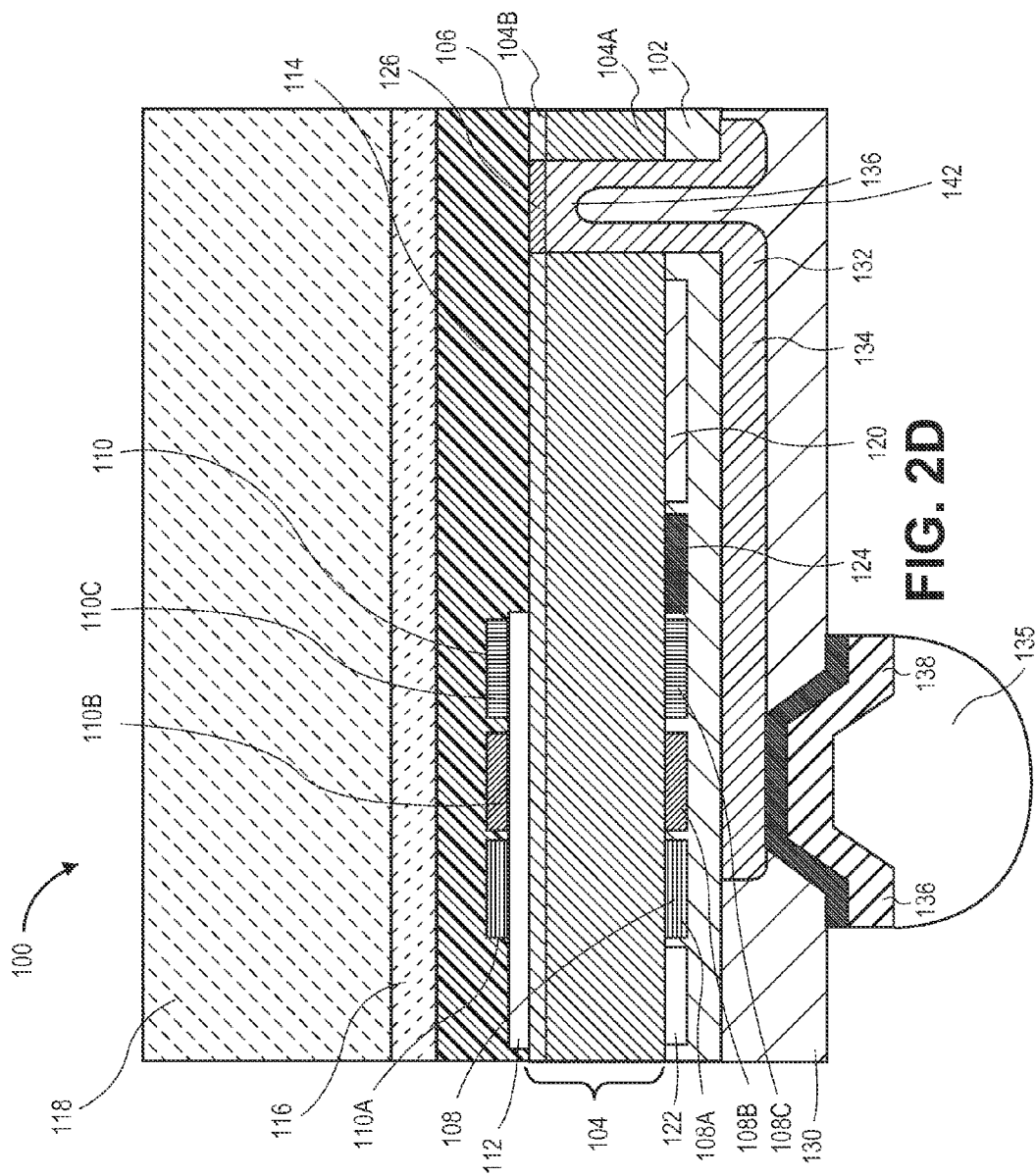

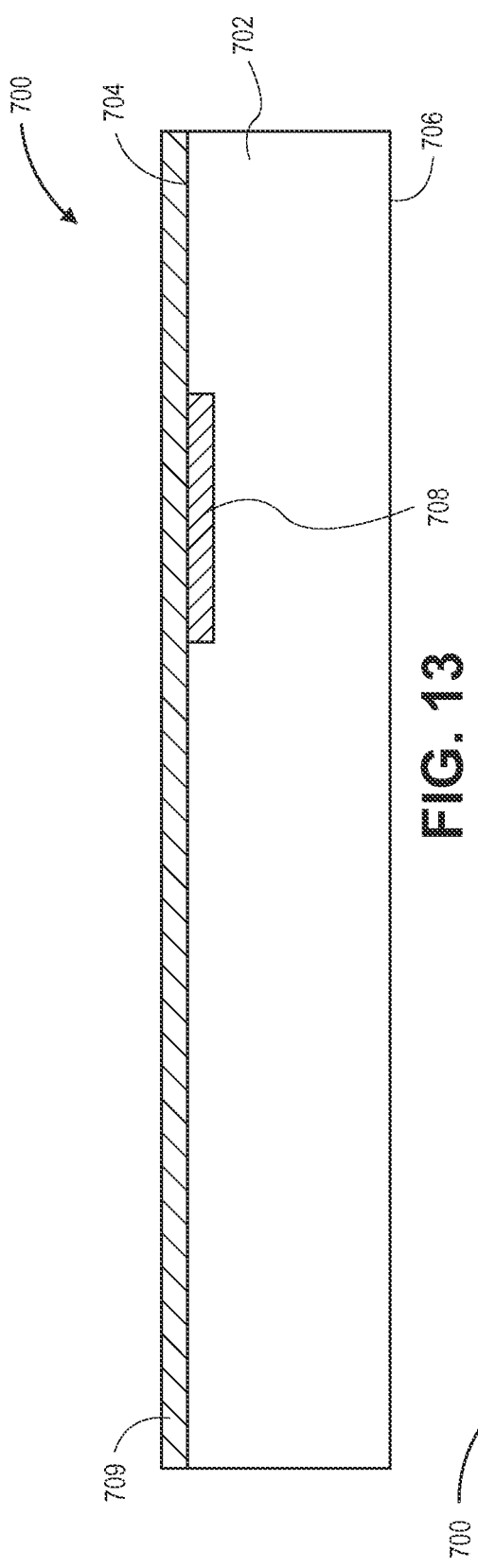
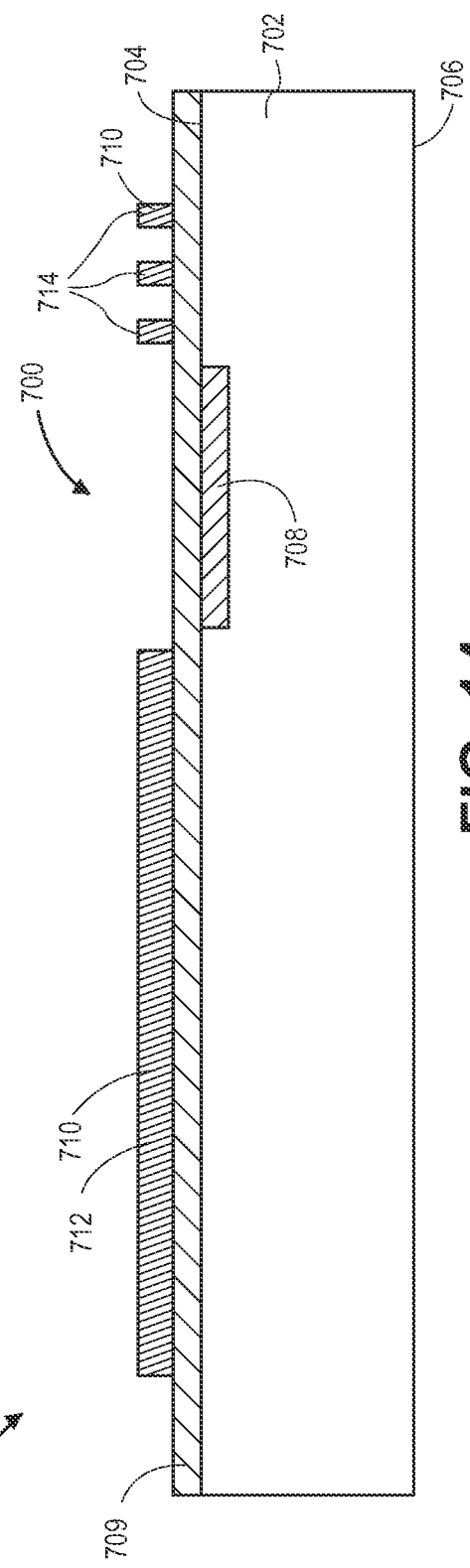

LIGHT SENSOR HAVING TRANSPARENT SUBSTRATE WITH LENS FORMED THEREIN

CROSS-REFERENCE TO RELATED APPLICATIONS

The present application is a divisional under 35 U.S.C. §120 of U.S. patent application Ser. No. 13/337,879 filed Dec. 27, 2011, entitled "LIGHT SENSOR HAVING TRANSPARENT SUBSTRATE WITH LENS FORMED THEREIN." U.S. application Ser. No. 13/337,879 is herein incorporated by reference in its entirety.

BACKGROUND

Electronic devices, such as smart phones, tablet computers, digital media players, and so forth, increasingly employ light sensors to control the manipulation of a variety of functions provided by the device. For example, light sensors are commonly used by electronic devices to detect ambient lighting conditions in order to control the brightness of the device's display screen. Typical light sensors employ photodetectors such as photodiodes, phototransistors, or the like, which convert received light into an electrical signal (e.g., a current or voltage).

Light sensors are commonly used in gesture sensing devices. Gesture sensing devices enable the detection of physical movement (e.g., "gestures") without the user actually touching the device within which the gesture sensing device resides. The detected movements can be subsequently used as input commands for the device. In implementations, the electronic device is programmed to recognize distinct non-contact hand motions, such as left-to-right, right-to-left, up-to-down, down-to-up, in-to-out, out-to-in, and so forth. Gesture sensing devices have found popular use in handheld electronic devices, such as tablet computing devices and smart phones, as well as other portable electronic devices, such as laptop computers, video game consoles, and so forth.

SUMMARY

A light sensor is described that includes an IR suppression filter (e.g., any type IR interference based filter) and at least one photodetector integrated on-chip (i.e., integrated on the die of the light sensor) with a transparent substrate. In one or more implementations, the light sensor comprises a semiconductor device (e.g., a die) that includes a semiconductor substrate. Photodetectors (e.g., photodiodes, phototransistors, etc.) are formed in the substrate proximate to the surface of the substrate. A IR suppression filter is positioned over the photodetectors. The IR suppression filter is configured to filter infrared light from light incident on the light sensor to at least substantially block infrared light from reaching the photodetectors. A buffer layer is formed over the surface of the substrate. In an implementation, a transparent substrate is coupled to the IR suppression filter to provide support to the IR suppression filter. In another implementation, the transparent substrate may be attached to the wafer (e.g., substrate wafer) with another buffer (e.g., adhesion) layer. In yet another implementation, the IR suppression filter may be positioned over the surface of the substrate so that the buffer layer is between the glass wafer and the substrate wafer. The photodetectors may also comprise one or more clear photodetectors configured to detect the ambient light environment.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

FIG. 2D is a diagrammatic partial cross-sectional side view illustrating another implementation of light sensor illustrated in FIG. 2C, wherein the light sensor includes a plurality of color pass filters and a plurality of photodetectors.

Figure 4:
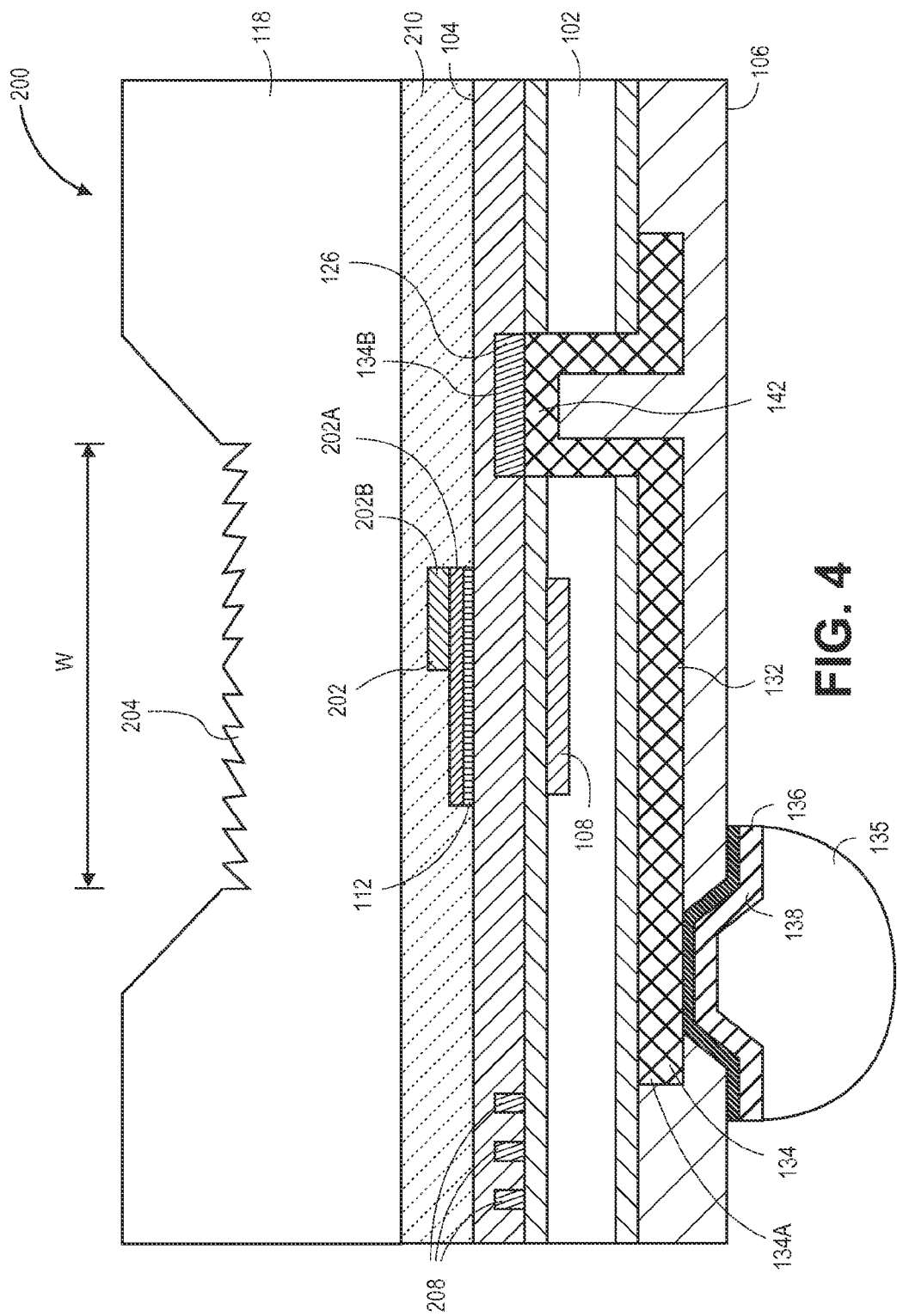
FIG. 4 is a diagrammatic partial cross-sectional side view illustrating a light sensor comprised of a semiconductor device having a photodetector, a plurality of color filters, and a transparent substrate having a lens in accordance with an example implementation of the present disclosure.
Figure 5:
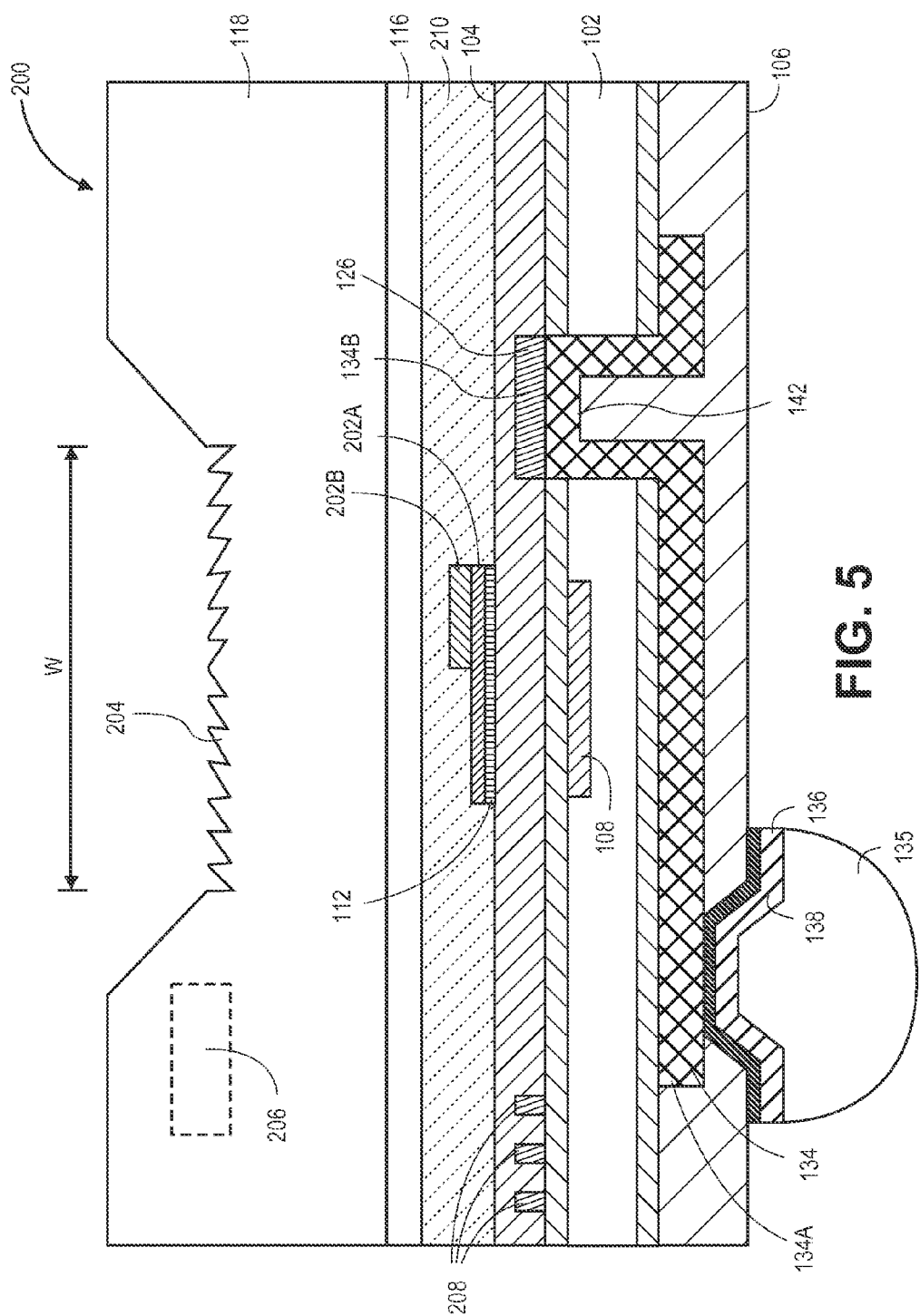
FIG. 5 is a diagrammatic partial cross-sectional view illustrating a light sensor in accordance with another example implementation of the present disclosure, where the light sensor illustrated in FIG. 4 further includes a IR suppression filter.
Figure 6:
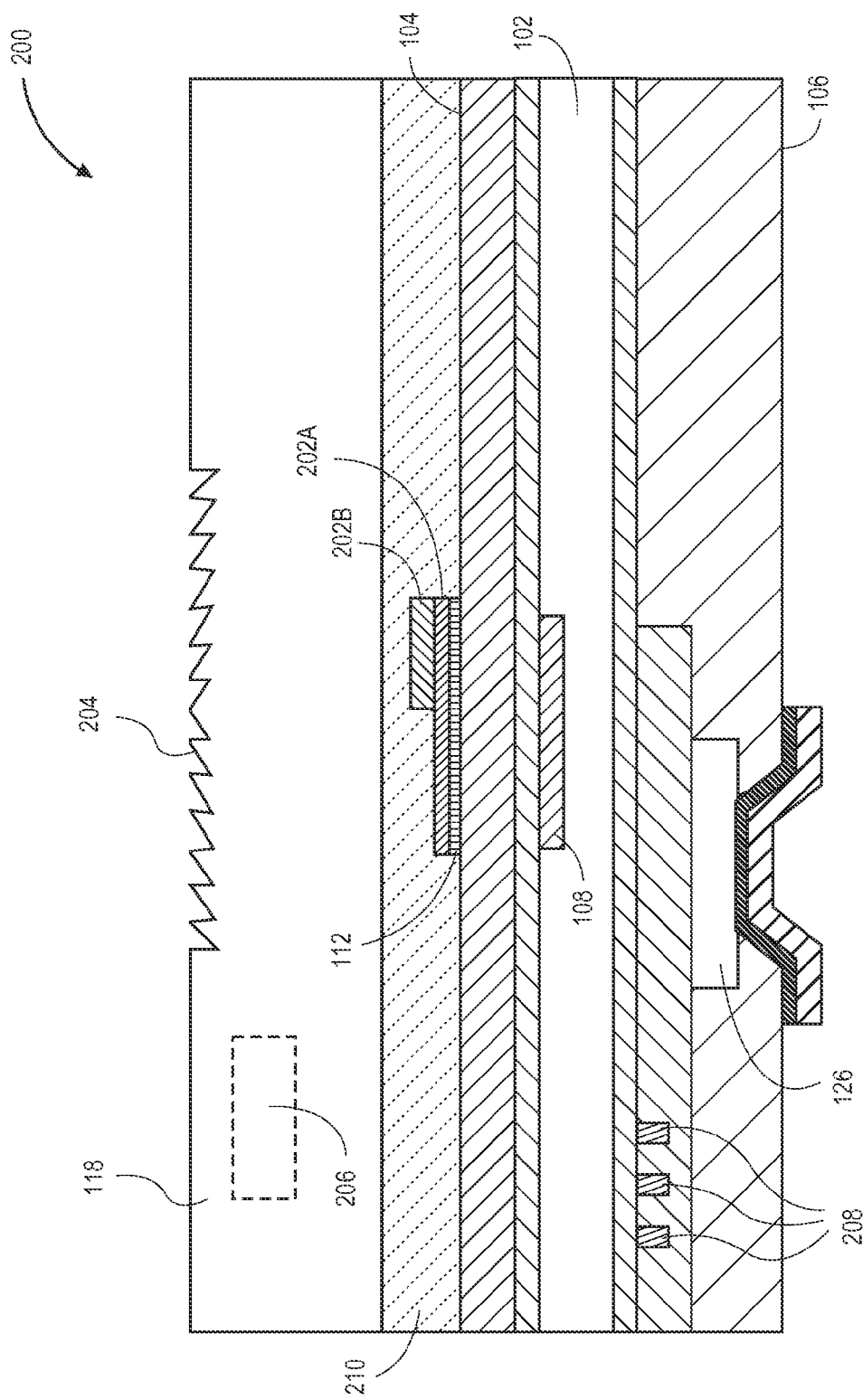
FIG. 6 is a diagrammatic partial cross-sectional view illustrating a light sensor in accordance with another example implementation of the present disclosure, wherein the light sensor illustrated in FIG. 4 is configured for backside illumination.
Figure 7:
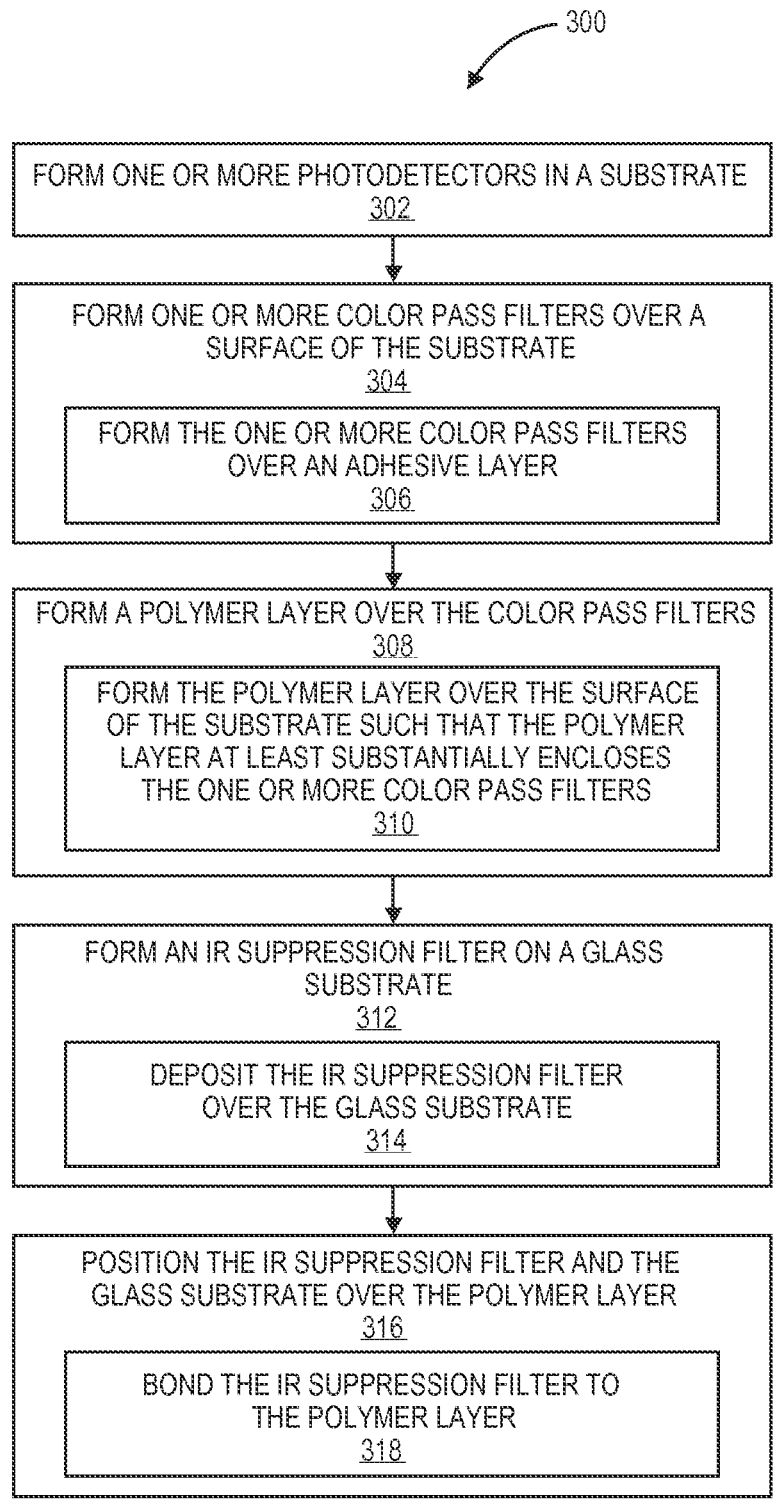
FIG. 7 is a flow diagram illustrating an example process in an example implementation for fabricating light sensors with an IR suppression filter and a transparent substrate, such as the sensor shown in FIG. 1A.
Figure 8:
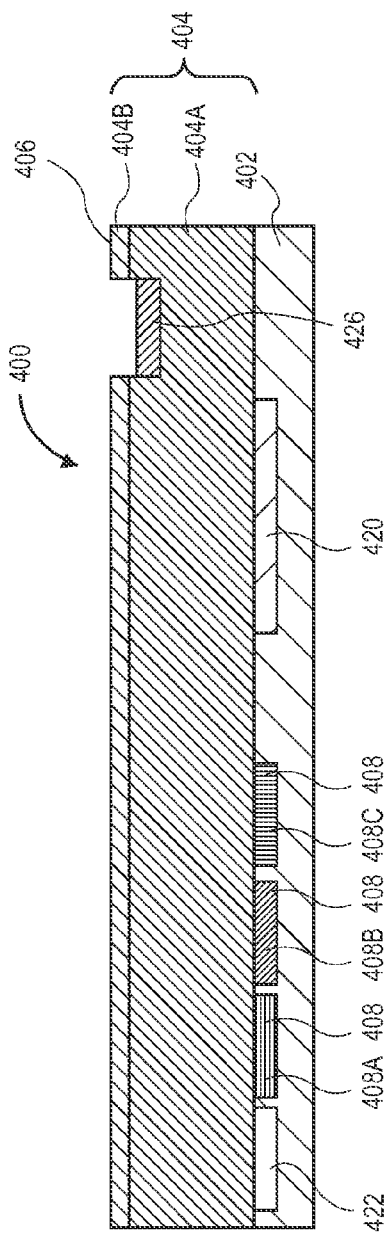
Figure 9:
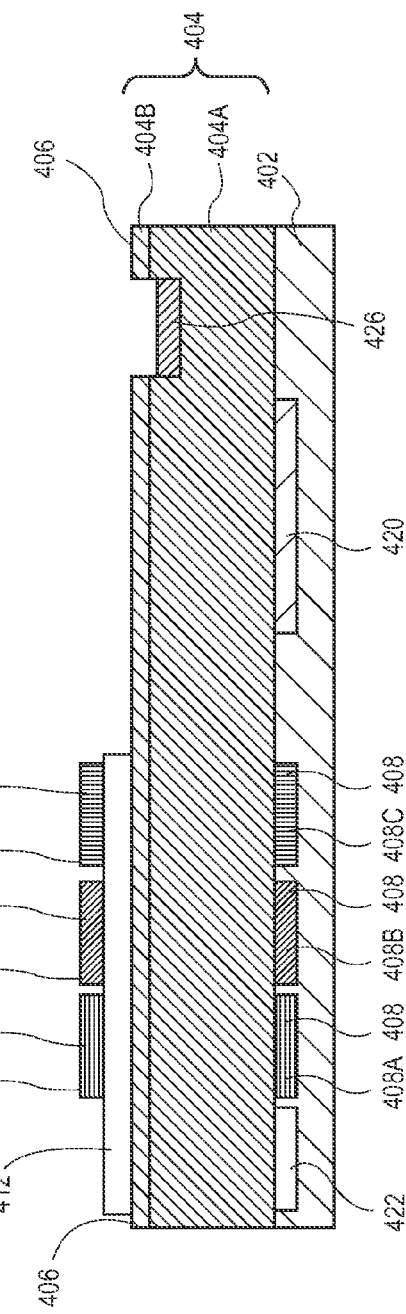
Figure 10:
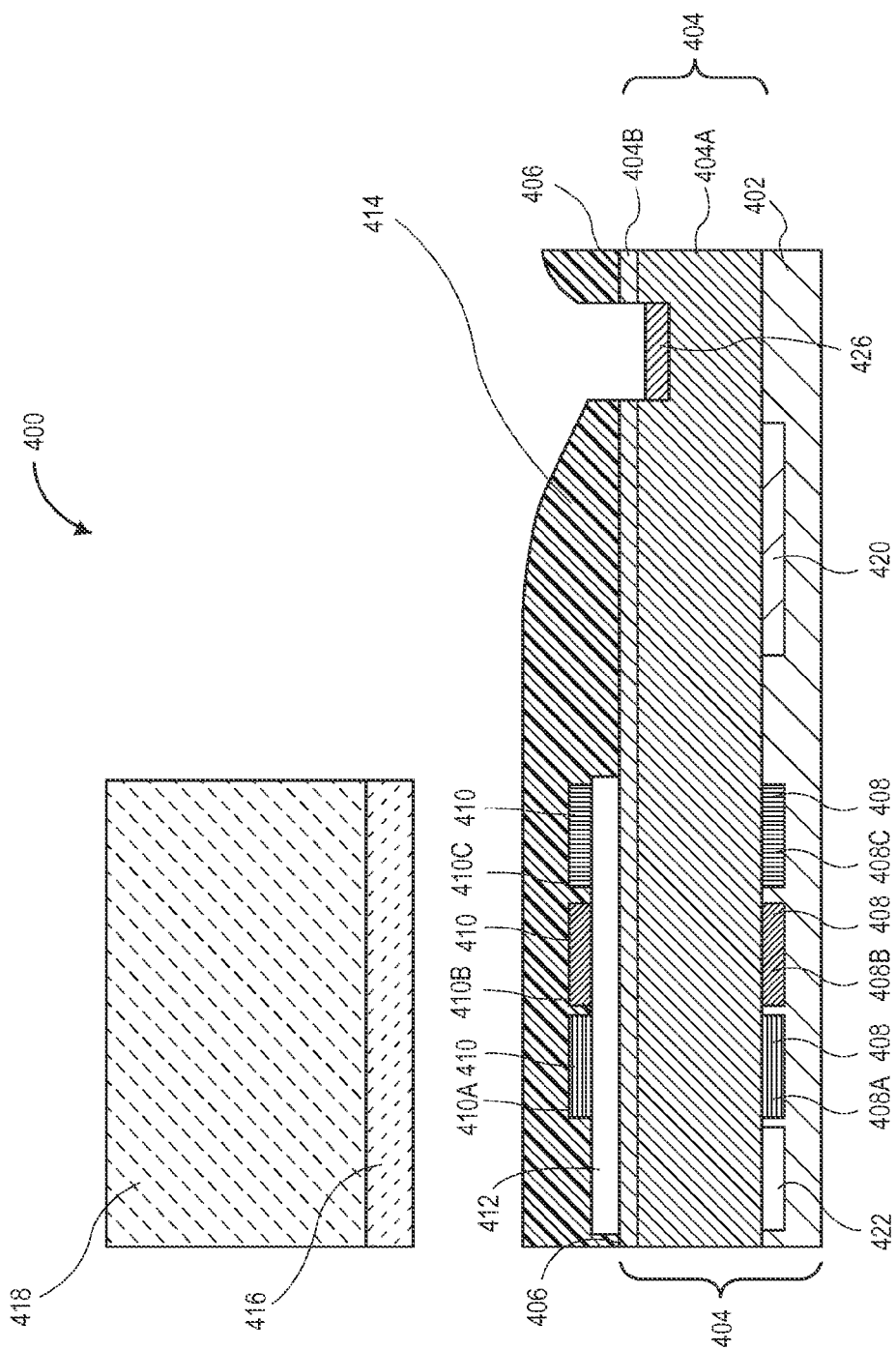

FIGS. 8 through 10 are diagrammatic partial cross-sectional side illustrating example fabrication steps of the light sensor illustrated in FIG. 1 in accordance with the techniques illustrated in FIG. 4, wherein FIG. 5 illustrates the photodetectors and a bond pad formed in the substrate; FIG. 6 illustrates color pass filters formed over the photodetectors; and FIG. 7 illustrates a buffer layer formed over the color pass filters and the IR suppression filter formed on a transparent substrate.

Figure 11:
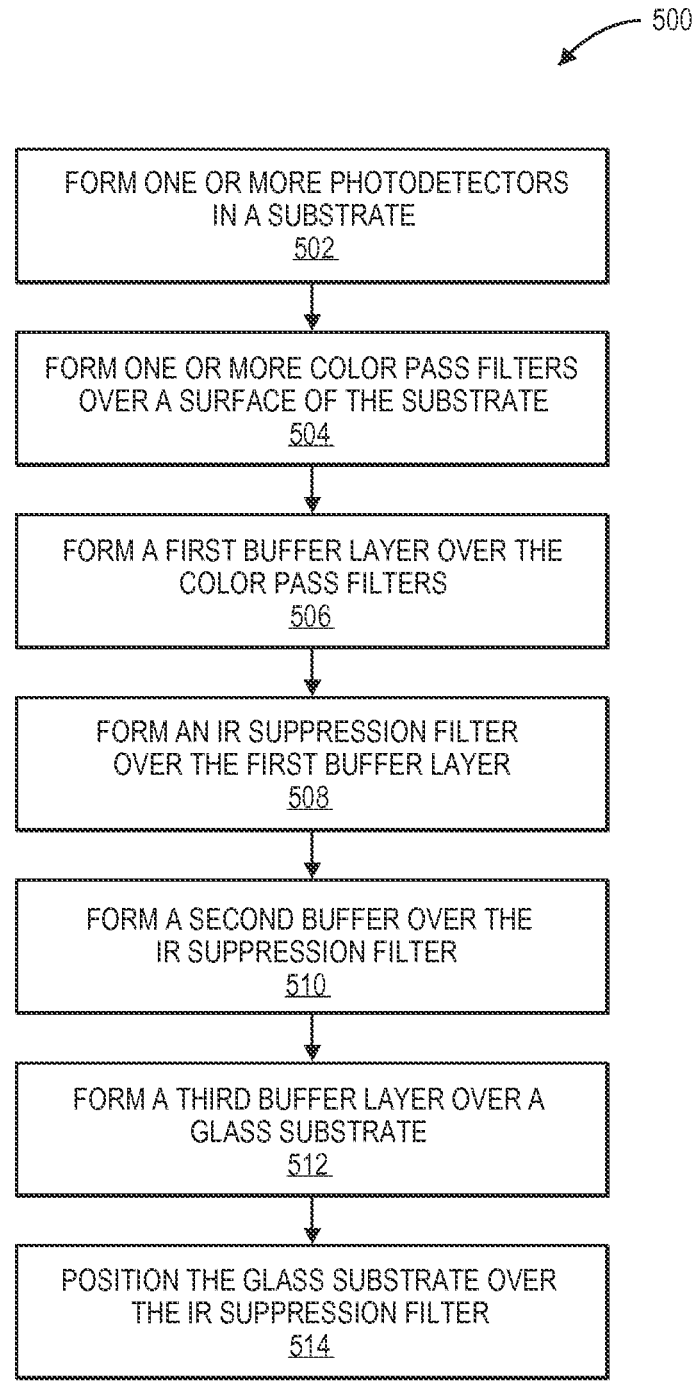

FIG. 11 is a flow diagram illustrating an example process in an example implementation for fabricating light sensors with an IR suppression filter and a transparent substrate, wherein the light sensors include the IR suppression filter positioned over a buffer layer that encapsulates the plurality of color pass filters.

Figure 12:
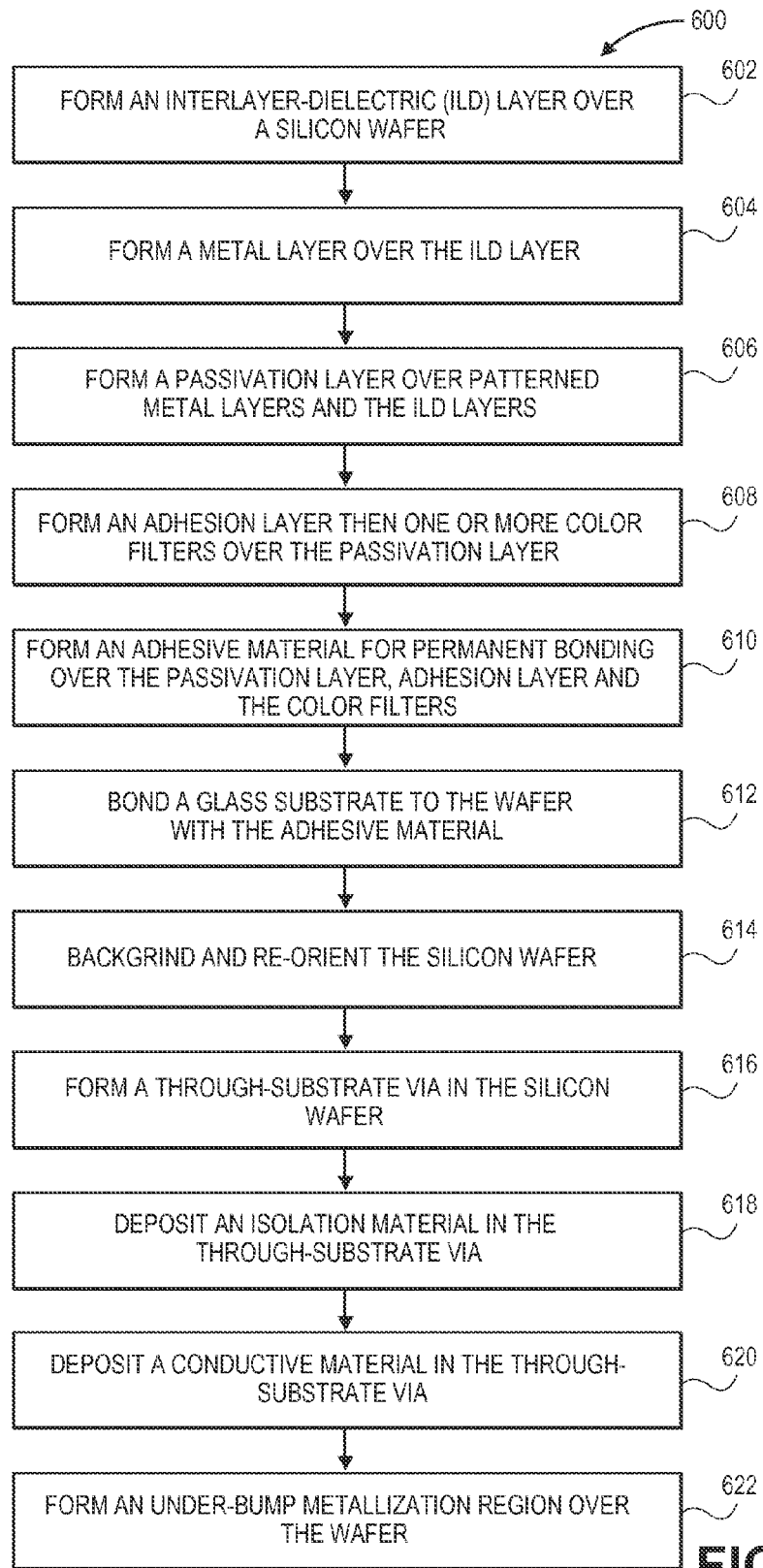

FIG. 12 is a flow diagram illustrating a process in an example implementation for fabricating light sensors, such as the sensor shown in FIG. 4.

FIGS. 13 through 27 are diagrammatic partial cross-sectional side elevation views illustrating the fabrication of a light sensor, such as the sensor shown in FIG. 4, in accordance with the process shown in FIG. 12.

DETAILED DESCRIPTION

Overview

To filter infrared light, light sensors may employ infrared blocking filters to reduce the transmission of infrared light, while passing visible light to the photodetector array of the light sensor. Such IR blocking filters are comprised of IR suppressing material applied externally to the light sensor package following fabrication of the package or included in the component during packaging. This configuration effectively blocks infrared light from reaching the photodiodes, but also substantially reduces the amount of infrared light that reaches the infrared photodetectors of the light sensor. Consequently, the sensitivity of the resulting light sensor to infrared light is reduced. Additionally, visible light sensors may employ subtraction techniques (i.e., subtraction circuits) to remove infrared light at the wafer level. However, spacing constraints restrict die area available for color pass filters, photodetectors, and subtraction circuits to continue to be utilized on the same chip as more photodetectors are required to detect light in a limited spectrum of wavelengths (e.g., "blue" light, "green" light, "red" light, etc.).

Accordingly, a light sensor is described that includes an IR suppression filter and at least one color pass filter integrated on-chip (i.e., integrated on the die of the light sensor). In one or more implementations, the IR suppression filter may be an IR cut filter, a notch interference filter, an absorption based filter, or a diffraction based filter. In one or more implementations, the light sensor is fabricated as a semiconductor device that comprises a die having a substrate. Photodetectors such as photodiodes, phototransistors, or the like, are formed in the substrate proximate to the surface of the substrate. One or more color pass filters are provided over the photodetectors. The color pass filters are configured to filter visible light received by the light sensor to pass light in a limited spectrum of wavelengths (e.g., light having wavelengths between a first wavelength and a second wavelength) to at least one of the photodetectors. For example, color pass filters (e.g., red, green, blue filters) may be formed on the surface of the substrate and aligned over the one or more photodetectors.

An IR suppression filter is positioned over the color pass filters. The IR suppression filter is configured to filter infrared light from light received by the light sensor to at least substantially block infrared light from reaching the photodetectors. However, the IR suppression filter may be selectively positioned so that it does not block infrared light to infrared photodetectors of the light sensor. During fabrication, a buffer layer is formed on the surface of the substrate at wafer level to at least substantially encapsulate and enclose the color pass filters to protect the filters during further processing steps and to planarize the wafer. The IR suppression filter is formed on a transparent substrate, and positioned proximate to the surface of the buffer layer over the photodetectors. The transparent substrate is configured to facilitate formation of the IR suppression filter, and to provide support to the IR suppression filter during fabrication of the light sensor. In another implementation, the IR suppression filter may be formed over the color pass filters, which are formed over the buffer layer. In this implementation, an adhesion layer is formed over the buffer layer and functions to bond the transparent substrate to the wafer substrate.

The photodetectors may also comprise one or more clear photodetectors configured to receive light that is not filtered by a color pass filter, thereby allowing the clear photodetector to detect the ambient light environment.

In the following discussion, example implementations of light sensors are first described. Example procedures are then discussed that may be employed to fabricate the example light sensor.

Example Implementations

FIGS. 1A through 3 illustrate light sensors 100 in accordance with an example implementation of the present disclosure. As shown, the light sensors 100 comprise semiconductor devices that include a die having a substrate 102. The substrate 102 furnishes a base material utilized to form one or more electronic devices through various fabrication techniques such as photolithography, ion implantation, deposition, etching, and so forth. The substrate 102 may comprise n-type silicon (e.g., a silicon doped with a group carrier element, such as a group V element (e.g., phosphorus, arsenic, antimony, etc.), to furnish n-type charge carrier elements to the silicon) or p-type silicon (e.g., silicon doped with a group carrier element, such as a group IIIA element (e.g., boron, etc.), to furnish p-type charge carrier elements to the silicon, or other group elements to furnish p-type charge carrier elements). The substrate 102 may further be comprised of one or more insulating layers 104 and may include a silicon dioxide layer 104A and a silicon nitride layer 104B. While a silicon substrate is described, it is understood that other types of substrates may be utilized without departing from the scope of this disclosure. For example, the substrate 102 may be comprised of silicon-germanium, gallium-arsenide, or the like.

The substrate 102 is illustrated as having a surface 106. An array of photodetectors (photodetectors 108, 120, 122 are shown) is formed in the substrate 102 proximate to the surface 106. The photodetectors 108, 120, 122 within the array may be configured in a variety of ways. For example, the photodetectors 108, 120, 122 may be comprised of a photo sensor diode, a phototransistor, or the like. In an implementation, the photodetectors 108, 120, 122 are capable of detecting light and providing a signal in response thereto. The photodetectors 108, 120, 122 may provide a signal by converting light into current or voltage based upon the intensity of the detected light. Thus, once a photodetector 108, 120, 122 is exposed to light, multiple free electrons may be generated to create a current. The photodetectors 108, 120, 122 are configured to detect light in both the visible light spectrum and the infrared light spectrum. As used herein, the term light is contemplated to encompass electromagnetic radiation occurring in the visible light spectrum and the infrared light spectrum. The visible light spectrum (visible light) includes electromagnetic radiation occurring in the range of wavelengths from approximately three hundred and ninety (390) nanometers to approximately seven hundred and fifty (750) nanometers. Similarly, the infrared light spectrum (infrared light) includes electromagnetic radiation that ranges in wavelength from approximately seven hundred (700) nanometers to approximately three hundred thousand (300,000) nanometers. In an implementation, complementary metal-oxide-semiconductor (CMOS) fabrication techniques may be utilized to form the photodetectors 108, 120, 122. In another implementation, bipolar fabrication techniques may be utilized to form the photodetectors 108, 120, 122. In yet another implementation, BiCMOS fabrication techniques may be utilized to form the photodetectors 108, 120, 122.

Color pass filters 110 are illustrated proximate to the surface 106. The color pass filters 110 are configured to filter visible light received by the light sensor 100 to pass light in a limited spectrum of wavelengths (e.g., light having wavelengths between a first wavelength and a second wavelength) to at least one of the photodetectors 108. In an implementation, the color pass filters 110 may comprise absorption filters that allow visible light in a limited spectrum of wavelengths to pass through the filter, while blocking (e.g., absorbing or reflecting) visible light within a second spectrum of wavelengths. Thus, the color pass filter 110 may be substantially transparent for visible light within a first spectrum of wavelengths, and substantially opaque within a second spectrum of wavelengths. In another implementation, the color pass filter 110 may comprise an interference filter that allows visible light to pass in a specified range of wavelengths.

A plurality of color pass filters 110 may be provided. For example, the light sensor 100 may comprise a first color pass filter 110A configured to filter visible light and to pass light having a first limited spectrum of wavelengths (e.g., wavelengths between a first wavelength and a second wavelength), a second color pass filter 110B configured to filter visible light and pass light having a second limited spectrum of wavelengths (e.g., wavelengths between a third wavelength and a fourth wavelength), and a third color pass filter 110C configured to filter visible light and pass light having a third spectrum of wavelengths (e.g., wavelengths between a fifth wavelength and a sixth wavelength), and so forth. In the example illustrated, the light sensor 100 is comprised of an array of three different color pass filters 110: a first (blue) color pass filter 110A configured to transmit a "blue" visible light (i.e., visible light with a wavelength between approximately four hundred fifty (450) nanometers and approximately four hundred seventy-five (475) nanometers); a second (green) color pass filter 110B configured to transmit a "green" visible light (i.e., visible light with a wavelength between approximately four hundred ninety-five (495) nanometers and approximately five hundred and seventy (570) nanometers); and a third (red) color pass filter 110C configured to transmit a "red" visible light (i.e., visible light with a wavelength between approximately six hundred and twenty (620) nanometers and approximately seven hundred and fifty (750) nanometers). It is contemplated that other visible light color pass filters 110 may be employed. The color pass filters 110 are combined with the IR suppression filter 116 since the color pass filters 110 may pass infrared light as well. For instance, color pass filters 110 configured to transmit visible light having limited spectrums of wavelengths typically associated with the colors of cyan, magenta, yellow, and so forth may be utilized. The color pass filters 110 are selectively arrayed over the photodetectors 108 to allow visible light in a desired limited spectrum of wavelengths to pass through the color pass filter 110 to the photodetector 108. For example, as shown in FIGS. 1A through 2B, the first color pass filter 110A is positioned over a first photodetector 108A, the second color pass filter 110B is positioned over a second photodetector 108B, and the third filter 110C is positioned over a third photodetector 108C.

In the implementations illustrated in FIGS. 1A through 2B, the color pass filters 110 are formed over the surface 106 using suitable deposition techniques such as spin coating and/or photo patterning (for absorption filter 110 formation). Likewise, suitable sputtering and plating techniques may be utilized for color interference filter 110 formation. In an example implementation, the color pass filters 110 have a thickness of approximately one (1) micron. However, it is contemplated that color pass filters 110 having lesser or greater thicknesses are possible. The color pass filters 110 may be formed on an adhesion layer 112 to hold the color pass filters 110 in position upon completion of the deposition techniques.

In one or more implementations, the color pass filters 110 may employ one or more color pass filters to further filter light (e.g., infrared light, etc.). In an implementation, a single color pass filter 110 (e.g., color pass filter 110A) may include a first color pass filter configured to filter visible light and to pass light having a first limited spectrum of wavelengths and a second color pass filter positioned over the first color pass filter that is configured to filter visible light and to pass light having a second limited spectrum of wavelengths. For example, a single color pass filter 110 may include a "blue" color pass filter positioned over a "red" color pass filter to further filter light. However, it is contemplated that other colors may be utilized (e.g., red over green color pass filter configuration, blue over green color pass filter configuration, etc.).

A buffer layer 114 is formed over the surface 106 of the substrate 102 to encapsulate and provide protection to the color pass filters 110. In the implementation shown in FIGS. 1A through 2B, the color pass filters 110 are formed on the surface 106 of the substrate 102. For instance, the color pass filters 110 are formed on the adhesion layer 112, which is formed on the surface 106. The buffer layer 114 is then applied to the surface 106 of the substrate 102 over the color pass filters 110. In this implementation, the buffer layer 114 at least substantially encapsulates, or encloses, the color pass filters 110 to protect the filters during further processing steps. The buffer layer 114 may be comprised of a polymer material such as Benzocyclobutene (BCB) polymer, or the like. However, it is contemplated that other buffer material may be used.

An IR suppression filter 116 is illustrated as positioned over the photodetectors 108 on the top surface 106 of the substrate 102. The IR suppression filter 116 is configured to filter infrared light from light received by the light sensor to at least substantially block infrared light from reaching the photodetectors 108, 122. For instance, in one or more specific implementations, an IR suppression filter 116 may be provided that is capable of blocking approximately fifty (50) to one hundred (100) percent of infrared light (i.e., light in the infrared spectrum) incident on the photodetectors 108, 122 while at least substantially passing (e.g., passing approximately greater than fifty (50) percent) visible light (i.e., light in the visible spectrum) to the photodetectors 108, 122. However, the aforementioned values (e.g., percentage values representing the proportion of infrared light blocked and/or passed by the IR suppression filter 116) may depend on particular application requirements of the light sensor 100. Thus, IR suppression filters 116 that are capable of blocking a higher or lower proportion of infrared light and/or of transmitting a higher or lower proportion of visible light are contemplated.

The IR suppression filter 116 may be configured in a variety of ways. For example, the IR suppression filter 116 may be comprised of a number of layers and/or a number of materials to at least partially suppress infrared light. It is contemplated that a various number of layers and/or materials may be utilized depending upon the amount of IR suppression desired in the light sensor 100. For example, in an implementation, the IR suppression filter 116 may comprise a multilayer structure that includes at least two (2) different materials that comprise different refractive indices. The IR suppression filter 116 may be approximately one (1) to approximately fifteen (15) microns thick and/or approximately ten (10) to approximately one hundred and twenty (120) layers thick. In a specific implementation, the IR suppression filter 116 may be approximately ten (10) microns thick. However, it is contemplated that the IR suppression filter 116 may have other constructions and/or thicknesses.

Figure 1A:
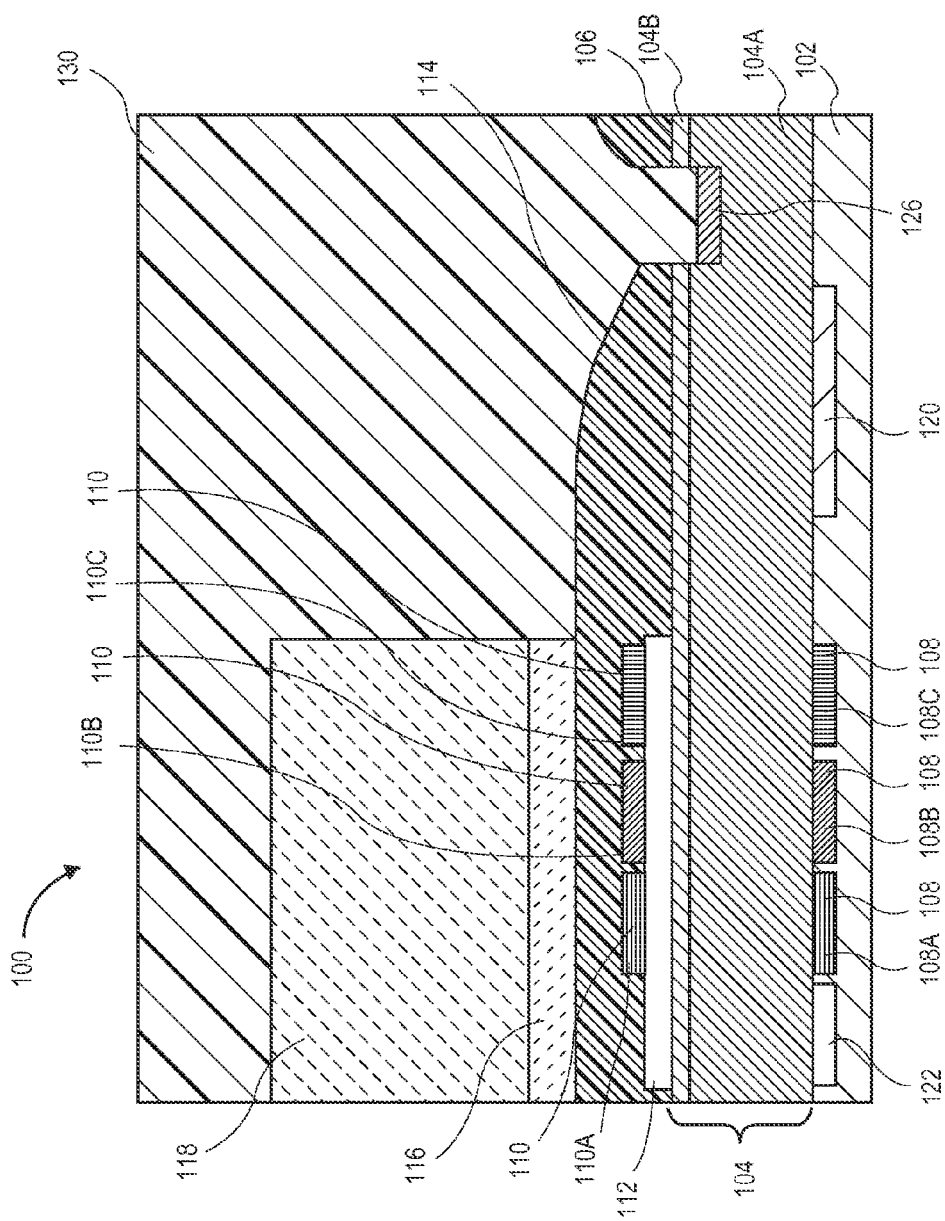
FIG. 1A is a diagrammatic partial cross-sectional side view illustrating a light sensor having an IR suppression filter formed on a transparent substrate, a plurality of color pass filters, and a buffer layer in accordance with an example implementation of the present disclosure.
Figure 1B:
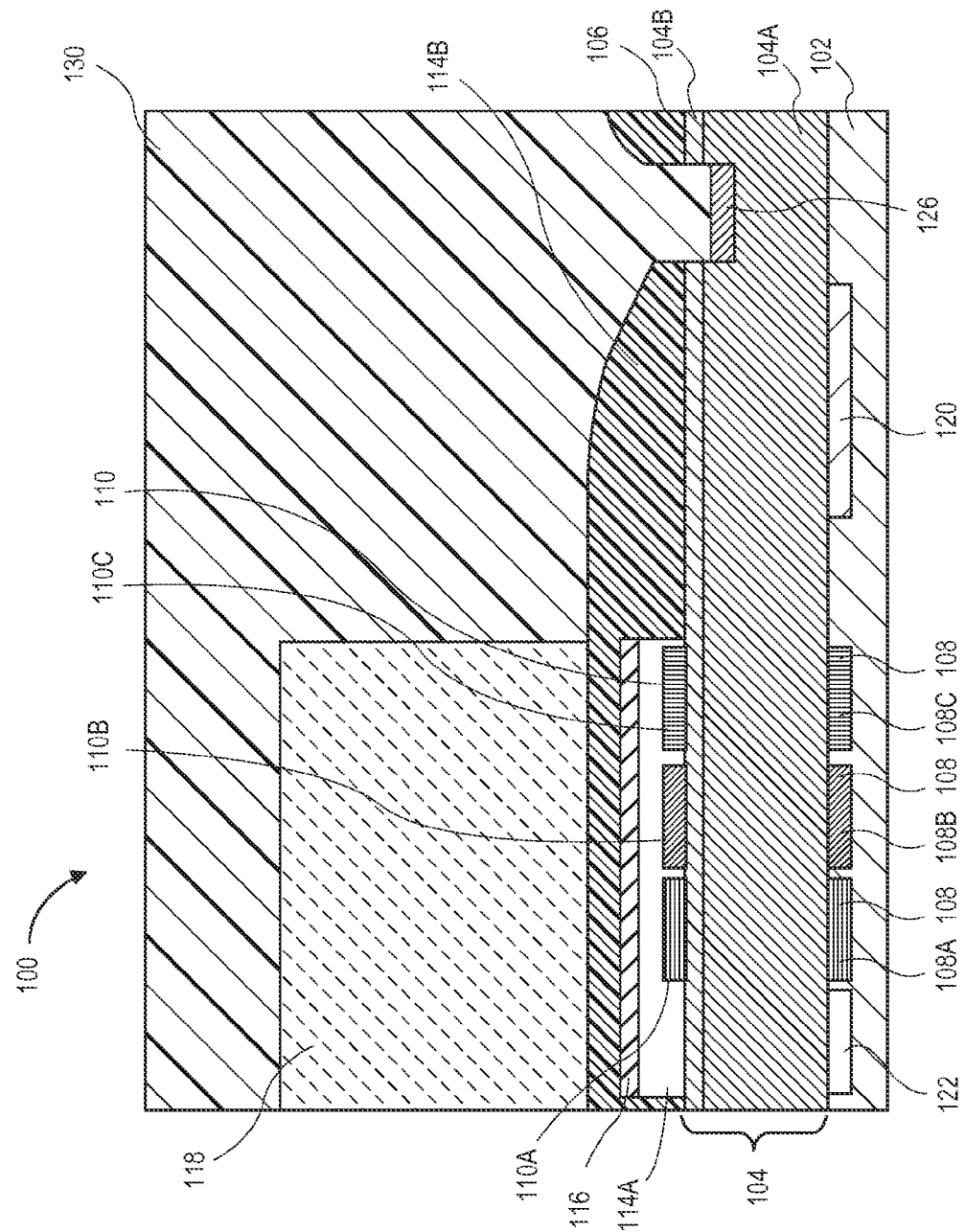
FIG. 1B is a diagrammatic partial cross-sectional side view illustrating another implementation of light sensor illustrated in FIG. 1A, wherein the IR suppression filter is disposed above the plurality of color pass filters.
Figure 1C:
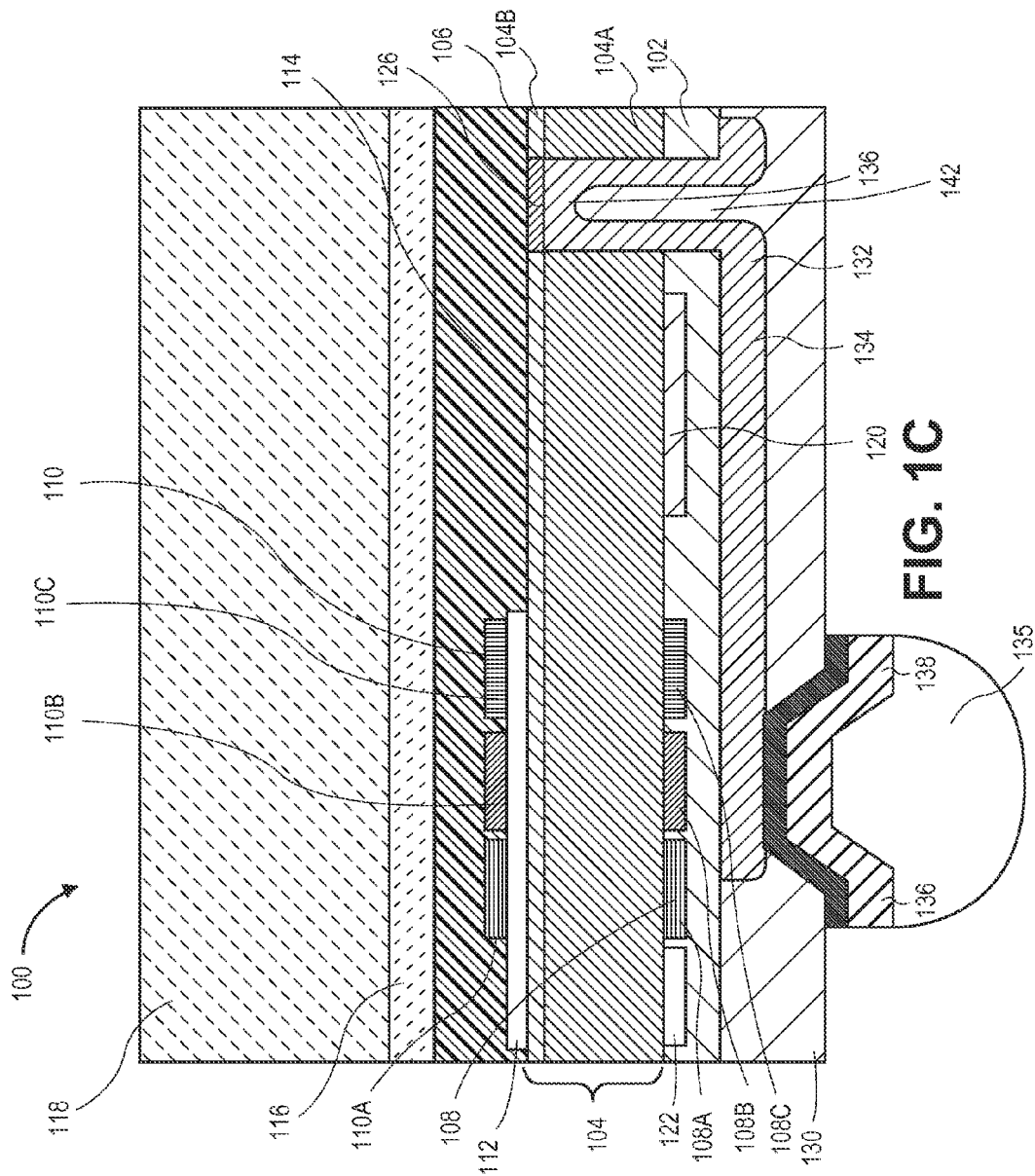
FIG. 1C is a diagrammatic partial cross-sectional side view illustrating another implementation of light sensor illustrated in FIG. 1A, wherein the light sensor further includes a through-substrate via.
Figure 1D:
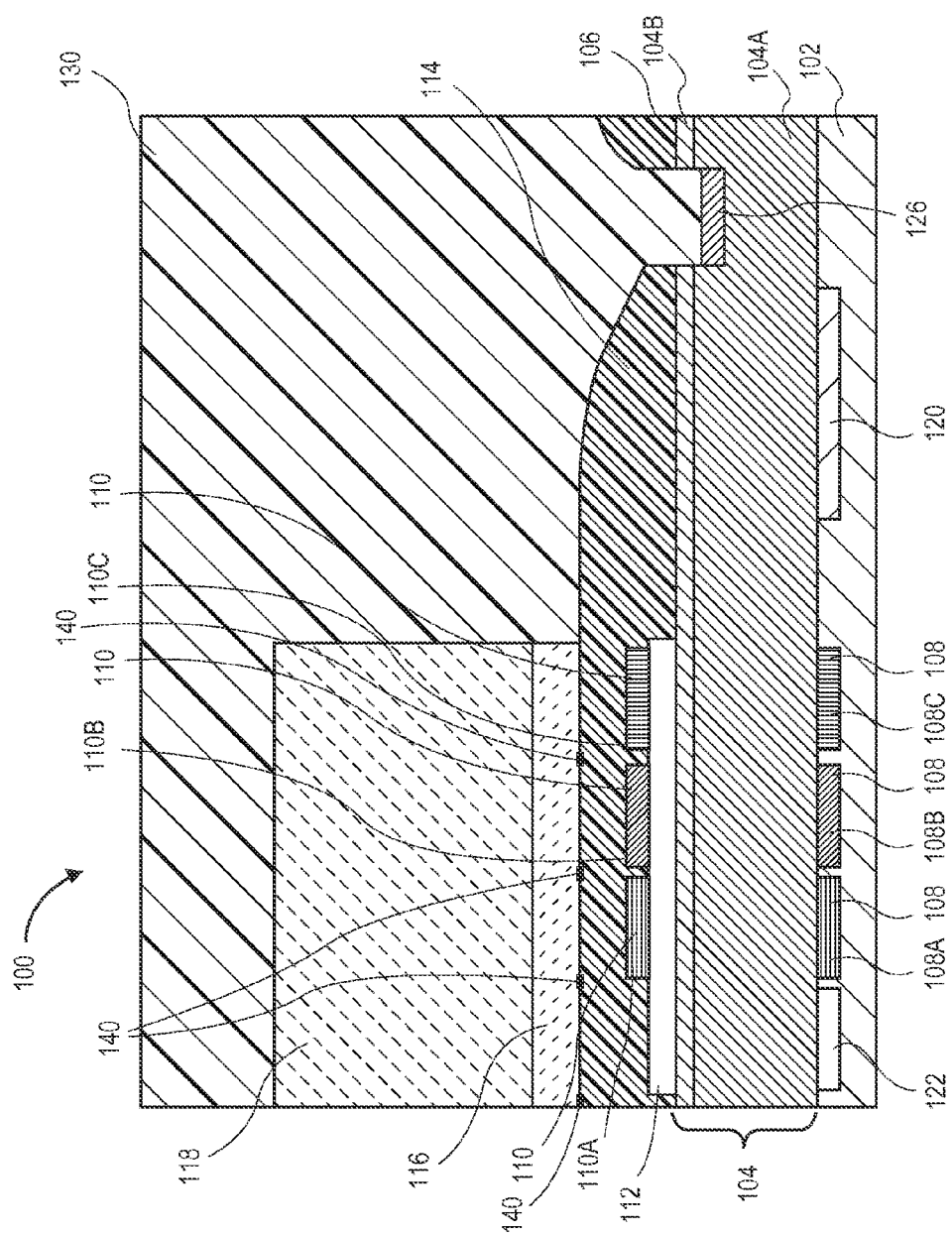
FIG. 1D is a diagrammatic partial cross-sectional side view illustrating another implementation of light sensor illustrated in FIG. 1B, wherein the light sensor further includes a dark edge disposed over the IR suppression filter.
Figure 2A:
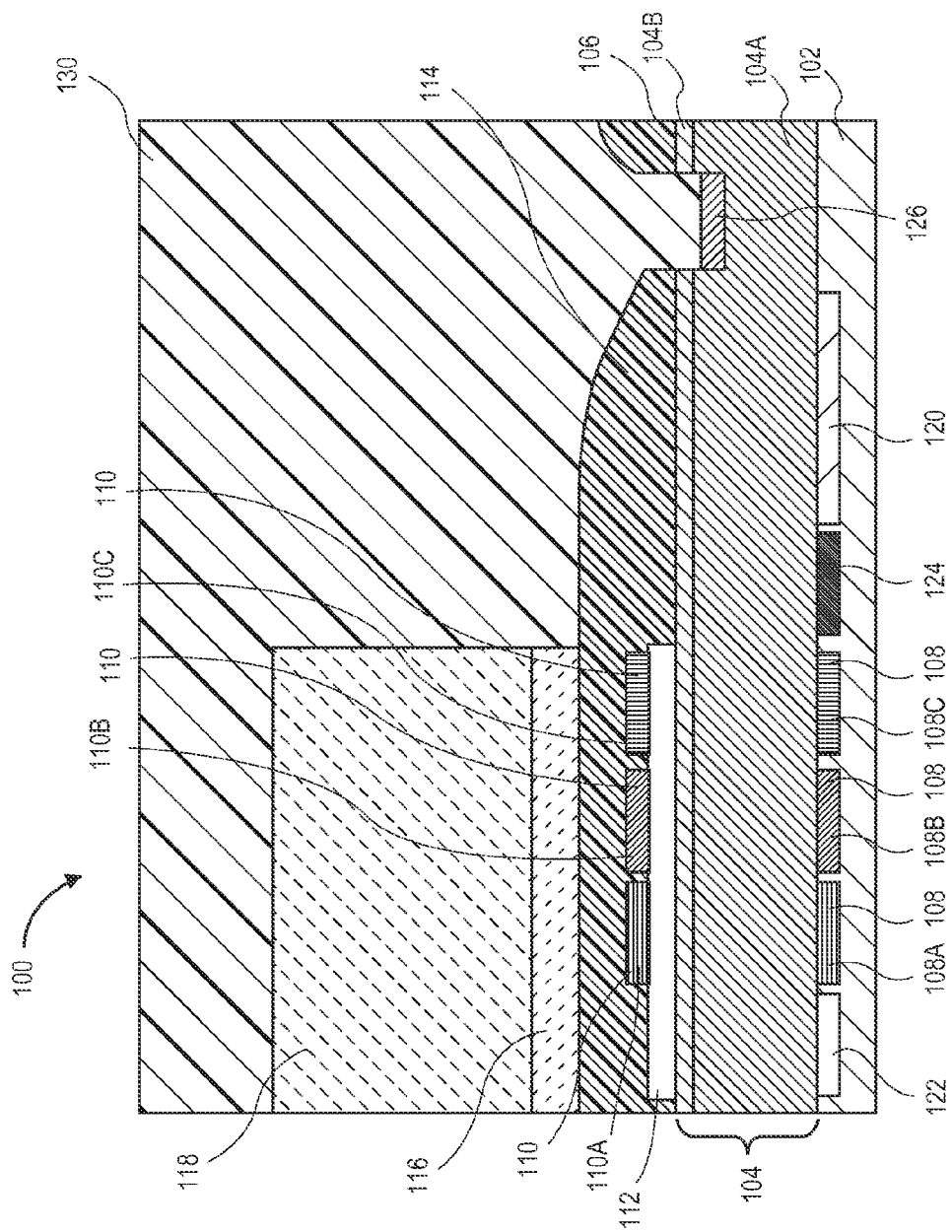
FIG. 2A is a diagrammatic partial cross-sectional side view illustrating an implementation of the light sensor depicted in FIG. 1A, where the light sensor also includes a dark current sensor.
Figure 2B:
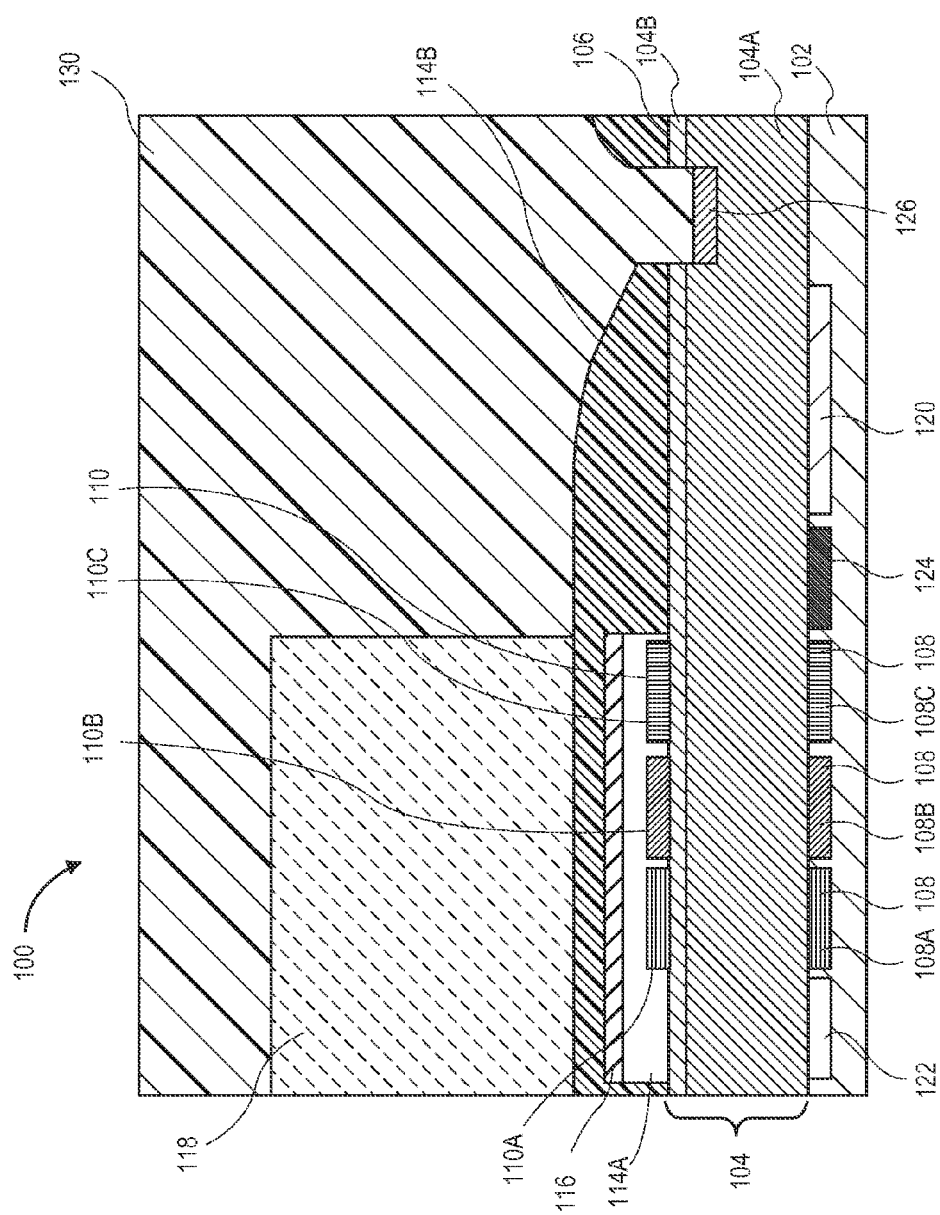
FIG. 2B is a diagrammatic partial cross-sectional side view illustrating another implementation of light sensor illustrated in FIG. 2A, wherein the IR suppression filter is disposed above the plurality of color pass filters.

In an implementation, a transparent substrate 118 is provided over the IR suppression filter 116 as illustrated in FIGS. 1A through 2B to facilitate formation of the IR suppression filter 116 and to furnish support to the IR suppression filter 116 during fabrication of the light sensor 100. In another implementation, the IR suppression filter 116 may be attached to the transparent substrate 118 and positioned over the light sensor 100. While the transparent substrate 118 (and the IR suppression filter 116 in FIG. 1A) is illustrated as being flush (e.g., even) with the adhesion layer 112 (see FIG. 1A) and with the buffer layer 114A (see FIG. 1B), it is contemplated that the transparent substrate 118 (and the IR suppression filter 116) may not necessarily be flush with (e.g., the transparent substrate 118 extends past) the adhesion layer 112 or the buffer layer 114A (e.g., due to processing variations, etc.). The transparent substrate 118 is configured to be transparent to light occurring within wavelengths of interest. For example, the transparent substrate 118 may be at least substantially transparent to light occurring within a limited spectrum of wavelengths (e.g., transparent to light occurring within the infrared wavelength spectrum and not transparent to light occurring within the visible wavelength spectrum, or vice versa). The transparent substrate 118 may be configured in a variety of ways. For example, the transparent substrate 118 may be a glass substrate. Thus, the glass substrate may have an anti-reflection coating that is at least substantially transparent (i.e., a low refractive index) to allow the light incident on the glass substrate to substantially pass through (i.e., low reflective metric) to the IR suppression filter 116. The IR suppression filter 116 may be formed on the transparent substrate 118 at wafer level using a suitable deposition technique. In such implementations, the transparent substrate 118 may be used to pattern the IR suppression filter 116. For example, the transparent substrate 118 may include one or more apertures formed therein. When the IR suppression filter 116 is formed on the transparent substrate 118, the IR suppression filter 116 may include one or more apertures aligned with the apertures of transparent substrate 118. In another implementation, which is shown in FIGS. 1B and 2B, the color pass filters 110 are formed over the surface 106 and then a first buffer layer 114A is then formed over the color filters 110. The IR suppression filter 116 is then formed over the first buffer layer 114A. A second buffer layer 114B (e.g., an insulating layer) is then formed over the substrate 102.

In one or more implementations, the light sensor 100 may be configured to include one or more infrared photodetectors 120 (i.e., photodetectors 108 that are configured to detect light in the infrared spectrum formed in the substrate 102 of the light sensor 100 die). These photodetectors 120 detect infrared light (i.e., light in the infrared spectrum) that may, for example, be transmitted by an infrared transmitter (e.g., an infrared light emitting diode (LED)) as part of a proximity sensor implemented in the electronic device. Accordingly, the IR suppression filter 116 may be patterned so that it does not block the reception of infrared light (i.e., light in the infrared spectrum) by the infrared photodetectors 120, thereby increasing the sensitivity of the light sensor to infrared light and improving the performance of devices that employ the light sensor 100 (e.g., the proximity sensor in an electronic device).

The array of photodetectors 108 may further include one or more clear photodetectors 122 configured to receive light that is not filtered by a color pass filter 110. As illustrated, the clear photodetectors 122 may be positioned in the substrate 102 so that they are positioned under the IR suppression filter 116 but are not located below a color pass filter 110. Thus, the clear photodetectors 122 detect light within a spectrum of wavelengths corresponding to several visible colors (i.e., light from the visible spectrum). In this manner, the clear photodetectors 122 may be used to detect visible ambient lighting conditions absent infrared interference.

The clear photodetectors 122 may be configured in a variety of ways. For example, like the other photodetectors 108 within the array, the clear photodetector(s) 122 may comprise a photodiode, a phototransistor, or the like, that is capable of detecting light by converting light into current or voltage. In an implementation, the signal (e.g., current or voltage) produced by the clear photodetectors 122 is based upon (e.g., proportional to) the detected intensity of visible light received. Thus, the clear photodetectors 122 may be used to detect the intensity of the ambient light level outside of a portable electronic device in which the light sensor 100 is integrated. The resulting measure of ambient light intensity may be utilized by various applications running in the portable electronic device. For example, an application of the portable electronic device may control the brightness of a display screen based upon the ambient light intensity.

As shown in FIGS. 2A and 2B, the light sensor 100 may also include a dark current sensor 124, which may be formed in the substrate 102 and proximate to the insulation layer 104. The dark current sensor 124 may be comprised of a dark photodiode, a dark phototransistor, or the like, that is configured to provide dark current (i.e., current generated by a photodiode when the photodiode is exposed to total darkness) to light sensor 100. The dark current sensor 124 may be configured in a variety of ways. For example, in one implementation, the dark current sensor 124 may be fabricated from a photodiode that includes a metal covering. In another implementation, the dark current sensor 124 may be fabricated from a photodiode having a filter that is configured to at least substantially block light. However, other implementations are possible.

As shown in FIGS. 1A through 2B, the light sensor 100 also includes a bond pad 126 to provide connectivity to light sensor 100. In an implementation, the bond pad 126 may be comprised of an electrically conductive area formed proximate to surface 104. For instance, the bond pad 126 may be comprised of a metal pad, a polycrystalline silicon (polysilicon) pad, or the like. The bond pad 126 may provide connectivity functionality between various electronic circuits (not shown) residing in light sensor 100 and package pins of a package (not shown) that encloses the light sensor 100.

In another implementation, as shown in FIGS. 1C, 1D, 2C, 2D and 2E the light sensors 100 may employ a Redistribution Layer (RDL) configuration. The RDL configuration employs a redistribution structure 132 comprised of a thin-film metal (e.g., aluminum, copper, etc.) rerouting and interconnection system that redistributes conductive layers 134 to an area array of bump interfaces 136 (e.g., UBM pads) that may be more evenly deployed over the surface of the sensor 100. The bump interface 136 is configured to provide a reliable interconnect boundary between the conductive layers 134 and solder bumps 135. The bump interface 136 comprises underbump metallization (UBM) 138 applied to the conductive layers 134 of the light sensor 100. The UBM 138 may have a variety of compositions. For example, the UBM 138 may include multiple layers of different metals (e.g., aluminum [Al], nickel [Ni], copper [Cu], etc.) that function as an adhesion layer, a diffusion barrier layer, a solderable layer, an oxidation barrier layer, and so forth. However, other UBM structures are possible.

In an implementation, as shown in FIGS. 1C, 2C, 2D, and 2E, the IR suppression filter 116 and the transparent substrate 118 may extend over the sensor 100. For instance, in a specific example, the IR suppression filter 116 and the transparent substrate 118 extend over the entire buffer layer 114.

Figure 2C:
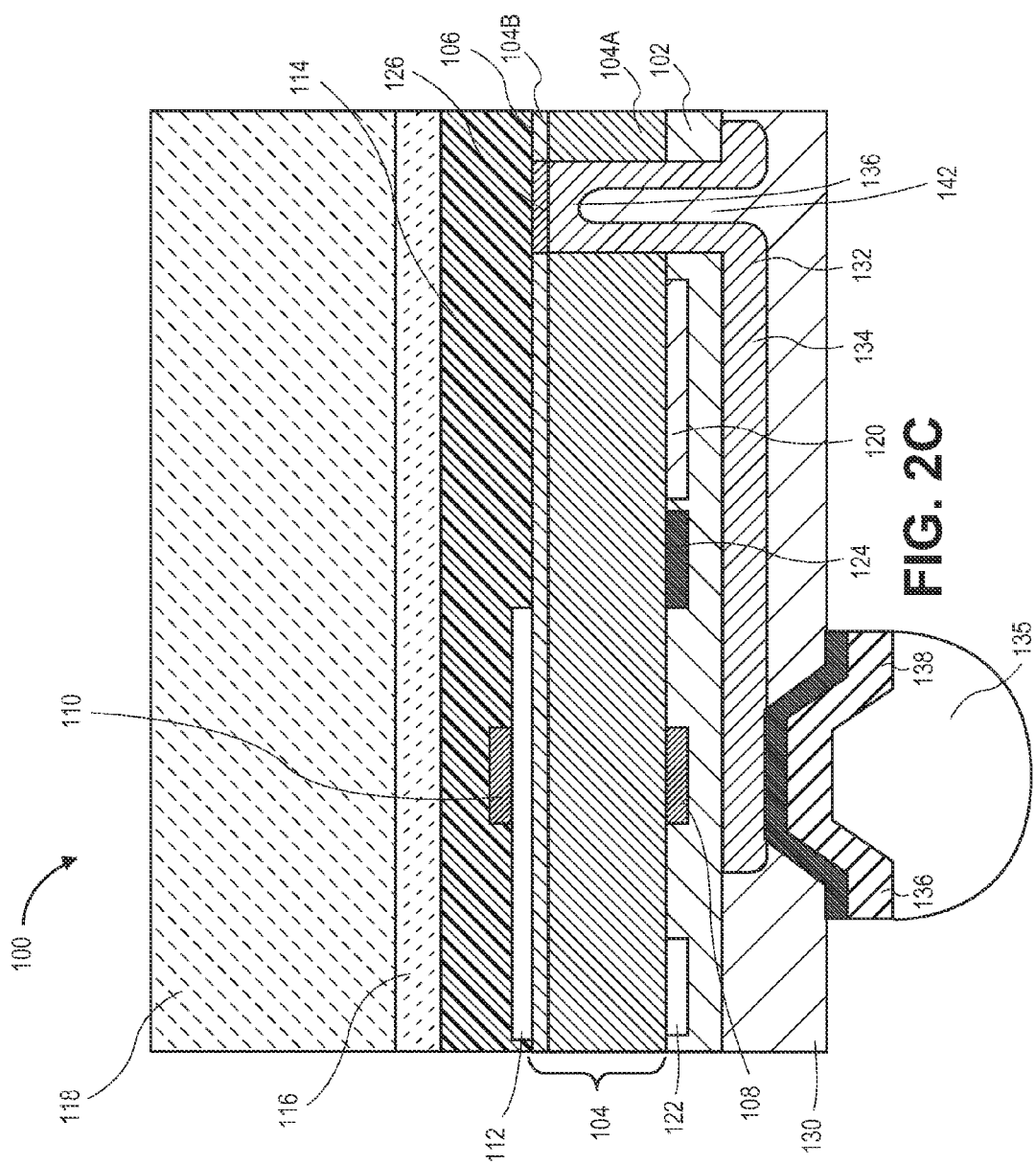
FIG. 2C is a diagrammatic partial cross-sectional side view illustrating another implementation of light sensor illustrated in FIG. 2A, wherein the light sensor further includes a through-substrate via.

As described above, the transparent substrate 118 and the IR suppression filter 116 include apertures such that the transparent substrate 118 does not extend over the infrared photodetectors 120, the dark current sensor 124, or the bond pad 126 when the IR suppression filter 116 and the transparent substrate 118 are positioned over the buffer layer 114 as shown in FIGS. 1 and 2. However, in other implementations, it is contemplated that the IR suppression filter 116 can extend over the dark current sensor 124. FIG. 3 illustrates multiple light sensors 100 fabricated on a wafer 144 and the transparent substrate 118 positioned over the wafer 144. The transparent substrate 118 includes multiple apertures (represented as the space enclosed by rectangle 128) positioned over infrared photodetectors 120 and bond pad 126. Thus, the IR suppression filter 116 also includes apertures aligned with the transparent substrate 118's apertures such that the IR suppression filter 116 does not cover (i.e., allows visible light and infrared light to pass unfiltered) infrared photodetectors 120 or the bond pad 126.

An insulating material 130 may be applied over the surface 106 of the substrate 102 to provide encapsulation and protection to the various structures of sensor 100 (e.g., the photodetectors 108, the color pass filters 110, the buffer material 114, the IR suppression filter 116, and so forth). In one or more implementations, the insulating material 130 is an epoxy material. However, other insulating materials may be used and are contemplated. The insulating material 130 may be selectively removed (e.g., etched) to provide access to the bond pad 126, and so on. Furthermore, as shown in FIGS. 1C and 2C, an insulating material 130 may be applied proximate to the redistribution structure 132 to provide further insulation and encapsulation to the photodetectors 108, 122. However, with the implementation shown in FIGS. 1C, 2C, 2D, and 2E, it is contemplated that an opening may be provided to the pad 126 from the front side.

Figure 2E:
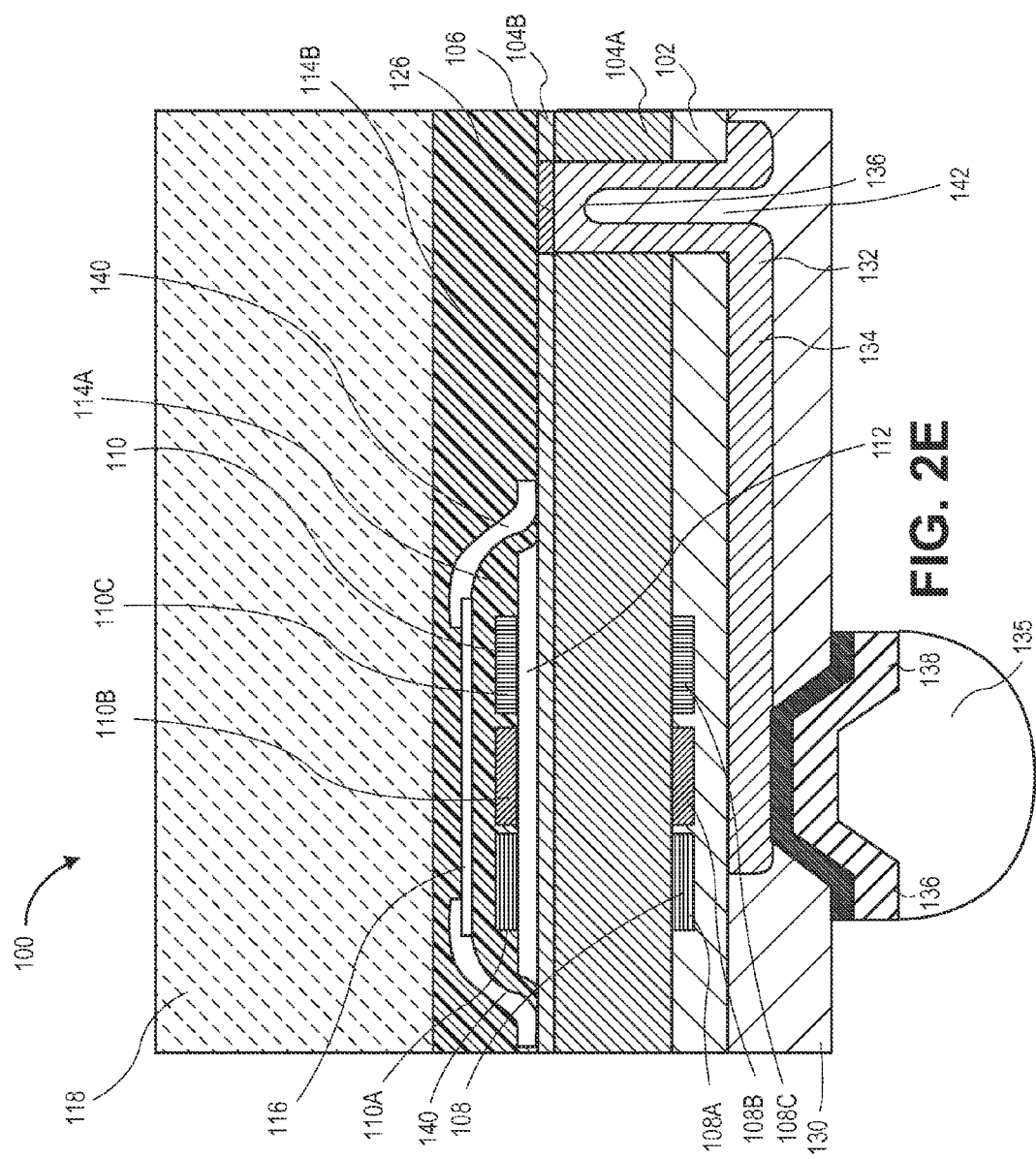
FIG. 2E is a diagrammatic partial cross-sectional side view illustrating another implementation of light sensor illustrated in FIG. 2D, wherein the light sensor includes a dark edge and an IR suppression filter disposed over the color pass filters.
Figure 3:
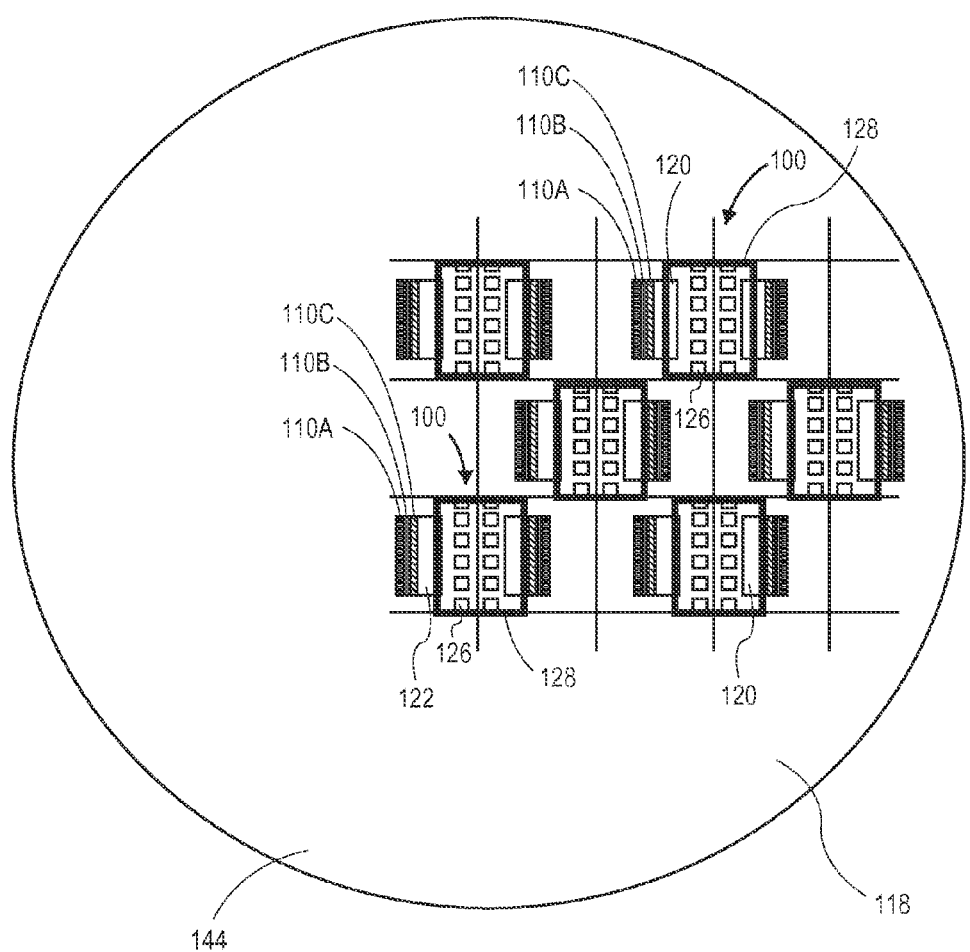
FIG. 3 is a diagrammatic top plan view of multiple light sensors depicted in FIGS. 1 and 2, formed in a wafer.

The sensor 100 may also include a dark edge 140 configured to at least substantially eliminate impingement of light that does not pass through the IR suppression filter 116 to the photodetectors 108, 122 (see FIGS. 1D and 2E). The dark edge 140 is formed of an opaque material that does not transmit light (visible light and infrared light). The dark edge 140 may be configured in a variety of ways. For instance, in a specific example, the dark edge 140 may be positioned over select portions (e.g., not directly over the color pass filters 110) of the buffer layer 114. In another example, the dark edge may be positioned over select portions (e.g., not directly over the color pass filters 110) of the transparent substrate 118, positioned over the side of the buffer layer 116 and the transparent substrate 118, combinations thereof, or the like. However, it is contemplated that the dark edge 140 may have a variety of patterns depending on application requirements.

In various implementations, the light sensors 100 described herein may be configured to detect a surrounding light environment and/or to provide infrared light detection (e.g., for use as a proximity sensor). The color pass filters 110 are configured to filter visible light and pass light in a limited spectrum of wavelengths to the respective photodetectors 108. The photodetectors 108 generate a signal (e.g., current value) based upon the intensity of the light. The IR suppression filter 116 is configured to filter infrared light to substantially block infrared light from reaching the photodetectors 108, 122. The clear photodetector(s) 122 detect ambient lighting conditions absent color filtration and generate a signal (e.g., a current value) based upon the intensity of visible light detected. The signal generated by the photodetectors 108 and the clear photodetector(s) 122 may be utilized by other circuit devices and/or applications to control various aspects of a portable electronic device (e.g., control the brightness of the device's display screen, to turn off backlighting to conserving battery life, and so forth). Infrared photodetectors 120 detect infrared light (e.g., light in the infrared spectrum) and generate a signal (e.g., a current value) based upon the intensity of the infrared light detected. The signal generated by the infrared photodetectors 120 may be utilized by other circuit devices and/or applications to control various aspects of a portable electronic device. For example, infrared light may be transmitted by an infrared transmitter (e.g., an infrared light emitting diode (LED)) and detected by the infrared photodetectors 120 of the light sensor 100 as part of an infrared image sensor or a proximity sensor implemented in an electronic device. The IR suppression filter 116 may be positioned so that it does not block the reception of infrared light by the infrared photodetectors 120, thereby increasing the sensitivity of the light sensor 100 to infrared light and improving the performance of devices that employ the light sensor 100.

FIGS. 4 through 6 illustrate light sensors in accordance with further example implementations of the present disclosure. As shown, the light sensors 200 further include color filters 202 (e.g., such as the color pass filters 110 described above). The color filters 202 are configured to pass light in a limited spectrum of wavelengths (e.g., light having wavelengths between a first wavelength and a second wavelength) to the photodetector 108. For example, the color filters 202 may be configured to pass light generated by the illumination source and to block light having wavelengths that are different than the illumination source (e.g., light occurring in a second wavelength). It is contemplated that the color filters 202 may comprise absorption filters. In one implementation, the color filters 202 allow light in a limited spectrum of wavelengths to pass through the filter, while blocking (e.g., reflecting or absorbing) light within a second spectrum of wavelengths. Thus, the color filters 202 may be substantially transparent for light within a first spectrum of wavelengths, and substantially opaque for light within a second spectrum of wavelengths. In implementations, the color filters 202 may comprise multilayer structures having varied thicknesses and/or numbers of layers, which may have differing thicknesses and/or refractive indices. Moreover, the color filters 202 may include a diffractive grading that allows for light within the first spectrum of wavelengths to at least substantially pass through.

As shown in FIG. 4, a plurality of color filters 202 may be employed. For example, the light sensor 200 may comprise a first color interference filter 202A configured to filter light and pass light having a first limited spectrum of wavelengths (e.g., wavelengths between a first wavelength and a second wavelength), and a second color interference filter 202B configured to filter light and pass light having a second limited spectrum of wavelengths (e.g., wavelengths between a third wavelength and a fourth wavelength), and so forth. In the example illustrated, the light sensor 200 is comprised of an array of three different color filters 202: a first (blue) color filter 202A configured to transmit a "blue" visible light (i.e., visible light with a wavelength between approximately four hundred fifty (450) nanometers and approximately four hundred seventy-five (475) nanometers); and a second (green) color filter 202B configured to transmit a "green" visible light (i.e., visible light with a wavelength between approximately four hundred ninety-five (495) nanometers and approximately five hundred and seventy (570) nanometers). It is contemplated that other visible light color filters 202 may be employed. For instance, color filters 202 configured to transmit visible light having limited spectrums of wavelengths typically associated with the colors of cyan, magenta, yellow, and so forth, may be utilized. The color filters 202 are selectively positioned over the photodetector 108 to allow light in a desired limited spectrum of wavelengths to be passed to the photodetector 108. Moreover, as shown in FIG. 4, the color filters 202A, 202B are shown in a stacked configuration (e.g., filter 202A is stacked over filter 202B) to allow for further filtering of light. For example, a color filter 202 may employ a first color filter configured to filter visible light and to pass light having a first limited spectrum of wavelengths and a second color pass filter positioned over the first color pass filter that is configured to filter visible light and to pass light having a second limited spectrum of wavelengths For example, a single color pass filter 202 may include a "blue" color pass filter positioned over a "red" color pass filter to further filter light. However, it is contemplated that other colors may be utilized (e.g., red over green color pass filter configuration, blue over green color pass filter configuration, etc.). A suitable adhesive (e.g., bonding) material 112 is utilized to at least substantially hold the color filters 202A, 202B over the photodetector(s) 108. While only one stacked configuration is shown, it is contemplated that other stacked configurations may be employed. For example, the color filters 202A, 202B may employ a non-stacked configuration.

As shown in FIG. 5, the light sensor 200 may further include an infrared (IR) suppression filter 116. The IR suppression filter 116 may be configured to pass light in a limited spectrum (e.g., a fourth spectrum) of wavelengths. For example, the IR suppression filter may be configured to filter infrared light from light received by the light sensor 100 to at least substantially block infrared light from reaching the photodetector 108. For instance, in an example implementation, an IR suppression filter 116 may be provided that is capable of blocking approximately fifty (50) to one hundred (100) percent of infrared light (i.e., light in the infrared spectrum) incident on the photodetector(s) 108 while at least substantially passing (e.g., passing approximately greater than fifty (50) percent) visible light (i.e., light in the visible spectrum) to the photodetector(s) 108. However, the aforementioned values (e.g., percentage values representing the proportion of infrared light blocked and/or passed by the IR suppression filter 116) may depend on particular application requirements of the light sensor 200. Thus, IR suppression filters 116 that are capable of blocking a higher or lower proportion of infrared light and/or of transmitting a higher or lower proportion of visible light are contemplated.

The substrate 102 may also include one or more integrated circuit devices formed therein through various fabrication techniques such as photolithography, ion implantation, deposition, etching, and so forth. The integrated circuits may be configured in a variety of ways. For example, the integrated circuits (not shown) may be digital integrated circuits, analog integrated circuits, mixed-signal circuits, and so forth. In one or more implementations, the integrated circuits may comprise digital logic devices, analog devices (e.g., amplifiers, etc.), combinations thereof, and so forth. As described above, the integrated circuits may be fabricated utilizing various fabrication techniques. For example, the integrated circuits may be fabricated via one or more semiconductor fabrication techniques. For example, the integrated circuits may be fabricated via complementary metal-oxide-semiconductor (CMOS) techniques, bi-polar semiconductor techniques, and so on.

As shown in FIGS. 4 through 6, sensor 200 includes one or more area arrays of conductive layers 134 to furnish electrical interconnection between various electrical components (e.g., photodetector 108 and an integrated circuit) associated with the sensor 200. In implementations, the conductive layers 134 may comprise one or more conductive (e.g., contact) pads, redistribution structures, or the like. In a further implementation, the conductive layers 134 may comprise seed metal and/or barrier metal layers to allow for plated-line formation. The number and configuration of conductive layers 134 may vary depending on the complexity and configuration of the integrated circuits, and so forth. The conductive layers 134 provide electrical contacts through which the integrated circuits are interconnected to other components, such as printed circuit boards (not shown), when the sensors 200 are configured as wafer-level packaging (WLP) devices or other integrated circuits disposed within the sensor 200. In one or more implementations, the conductive layers 134 may comprise an electrically conductive material, such as a metal material (e.g., aluminum, copper, etc.), or the like.

The conductive layer 134 may also provide electrical interconnection with one or more solder bumps. Solder bumps are provided to furnish mechanical and/or electrical interconnection between the conductive layers 134 and corresponding pads (not shown) formed on the surface of a printed circuit board (not shown). In one or more implementations, the solder bumps may be fabricated of a lead-free solder such as a Tin-Silver-Copper (Sn—Ag—Cu) alloy solder (i.e., SAC), a Tin-Silver (Sn—Ag) alloy solder, a Tin-Copper (Sn—Cu) alloy solder, and so on. However, it is contemplated that Tin-Lead (PbSn) or Nickel-Aluminum (NiAu) solders may be used.

Bump interfaces 136 may be applied to the conductive layers 134 to provide a reliable interconnect boundary between the conductive layers 134 and the solder bumps. For instance, in the sensor 200 shown in FIGS. 4 and 5, the bump interface 136 comprises under-bump metallization (UBM) 138 applied to the conductive layers 134 of the light sensor 100. The UBM 138 may have a variety of compositions. For example, the UBM 138 may include multiple layers of different metals (e.g., aluminum [Al], nickel [Ni], copper [Cu], etc.) that function as an adhesion layer, a diffusion barrier layer, a solderable layer, an oxidation barrier layer, and so forth. However, other UBM structures are possible.

In one or more implementations, the sensor 200 may employ a Redistribution Layer (RDL) configuration. The RDL configuration employs a redistribution structure 132 comprised of a thin-film metal (e.g., aluminum, copper, etc.) rerouting and interconnection system that redistributes the conductive layers 134 to an area array of bump interfaces 208 (e.g., UBM pads) that may be more evenly deployed over the surface of the sensor 200.

As shown in FIGS. 1C, 2C, 2D, 2E, 4, and 5, the sensors 100, 200 may further include a through-substrate via 142 (TSV) that extends through the substrate 102. The TSV 142 is configured to furnish an electrical interconnection between a first conductive landing (e.g., layer) 134A (e.g., the UBM 138) and a second conductive landing (e.g., layer) 134B (e.g., a bond pad, such as bond pad 126, proximate to the photodetector 108) of the sensor 200 when the TSV 142 is filled with a conductive material 134. In one or more implementations, the conductive material 134 may comprise a metal such as copper, or the like. The light sensor 200 may employ TSVs 142 of varying dimensions depending on the requirements of the light sensor 200.

As illustrated in FIGS. 4 through 6, a transparent substrate 118 is positioned over the first surface 104 of the substrate 102. In one or more implementations, the transparent substrate 118 may be formed from a glass wafer, or the like, as discussed herein. The transparent substrate 118 is configured to at least substantially allow for the passage of light through the transparent substrate 118. In an implementation, the transparent substrate 118 is configured to allow for sufficient passage of light through the transparent substrate 118. In one example, the transparent substrate 118 is configured to at least substantially allow for the passage of at least ninety (90) percent of light through the transparent substrate 118. However, other percentages are contemplated. For example, the transparent substrate 118 may at least substantially pass through light that is reflected from an object proximate (e.g., above) to the sensor 200. The transparent substrate 118 also includes a lens 204 to focus and to transmit light incident upon the transparent substrate 118. As shown in FIGS. 4 through 6, the lens 204 is positioned over the color filters 202. It is contemplated that the lens 204 is configured to focus and to transmit light incident upon the transparent substrate 118 from multiple angles. The lens 204 may be configured as a Fresnel lens, a ball lens, a diffractive lens, a diffractive optics element (DOE) lens, a gradient-index (GRIN) optics lens, another type of lens, or the like, that is configured to collimate the light incident on the lens 204. In an implementation, the lens 204 may be indented. In another implementation, depending upon the configuration of the sensor 200, the lens 204 may be on either side of the transparent substrate 118. Moreover, the light sensor 200 may include a diffuser 206 next to or in place of the lens 204. The lens 204 may take in light from multiple angles and collimate that light so that the collimated light at least substantially passes through the substrate 118 to the color filters 202 and eventually to the photodetector 108. In one or more implementations, a width (W) of the lens 204 may be approximately 0.52 millimeters (mm). However, the width of the lens may vary depending on various design configurations of the sensor 200.

It is also contemplated that the light sensor 200 may be configured in a variety of ways. For example, the light sensor 200 may employ no lens 204 and instead employ a diffuser 206 and/or an IR suppression filter 116. The diffuser 206 and/or the IR suppression filter 116 may be configured to also pass through light (in a limited spectrum of wavelengths to the color filters 202). In another implementation, as shown in FIG. 5, the light sensor 200 may employ both a lens 204 and an IR suppression filter 116 (e.g., an IR interference filter or other type of filter). As shown, the IR suppression filter 116 is disposed between the transparent substrate 118 and the substrate 102. However, it is understood that other IR suppression filter 116 configurations are possible. The lens 204 is configured to first take in light from multiple angles and collimate that light so that the collimated light at least substantially passes through the transparent substrate 118 to the IR suppression filter 116, which passes light in a limited spectrum of wavelengths (e.g., at least substantially filters IR light and at least substantially passes visible light). The filtered light is then passed to the color filters 202 to further filter the light. The further filtered light from the color filters 202 is then passed to the photodetector(s) 108 for detection. In the implementation shown in FIG. 2, the IR suppression filter 116 may be deposited over the transparent substrate 118 and then positioned over the surface 104, or the IR suppression filter 116. In another implementation, the IR suppression filter 116 and/or the diffuser 206 may be integral with the transparent substrate 124 (e.g., the IR suppression filter 116 and/or the diffuser 206 is manufactured with the transparent substrate 124).

The transparent substrate 118 may be positioned over the substrate 102 with the assistance of one or more alignment marks 208. Once the transparent substrate 118 is properly positioned over the substrate 102, the transparent substrate 118 may be bonded to the substrate 102 with a suitable adhesive material 210. In one or more implementations, the suitable adhesive material 210 may be a benzocyclobutene (BCB) material, an epoxy material, or the like. The adhesive material 210 is also configured to at least substantially pass through light incident on the material 210.

In an aspect of the present disclosure, the light sensors 200 described herein may be configured for use as or as part of a gesture sensing device. For example an illumination source, such as a light emitting diode (LED), generates light (e.g., infrared and/or or visible light) that is reflected off an object proximate to the sensor 200. In one or more implementations, the light sensor 200 may employ only a single illumination source. However, multiple illumination sources are also contemplated. The lens 204 focuses (e.g., collimates) and transmits the reflected light incident on the lens 204 so that the light is passed through the color filters 202 and detected by photodetector 108. As described above, lens 204 may focus and transmit light incident from multiple angles. The photodetector 108 is configured to generate a signal in response thereto and may provide the signal to one or more integrated circuits formed in the substrate 102. The signals may provide a basis for gesture based programming including, but not limited to: executing one or more computer programs, executing an application (e.g., an app), flick scrolling, and so forth.

While FIGS. 4 and 5 illustrate a light sensor 200 that employs a Redistribution Layer (RDL) configuration, it is contemplated that the sensor 200 illustrated and described herein may also employ a Bump-On-Pad (BOP) configuration as shown in FIG. 6. The BOP configuration may employ a conductive bond pad 126 disposed under the bump interface 136 (e.g., UBM pads).

Example Fabrication Process

The following discussion describes example techniques for fabricating a light sensor that includes at least one color pass filter integrated on-chip (i.e., integrated on the die of the light sensor) and an IR suppression filter bonded to a transparent substrate. In the implementation described below, the light sensors are fabricated utilizing complementary metal-oxide-semiconductor (CMOS) processing and packaging techniques. However, it is contemplated that light sensors in accordance with the present disclosure may be fabricated using other semiconductor chip fabrication/packaging technologies, such as wafer-level packaging (WLP).

FIG. 7 depicts a process 300, in an example implementation, for fabricating a light sensor, such as the example light sensors 100 illustrated in FIGS. 1A and 2A. In the process 300 illustrated, one or more photodetectors are formed in a substrate of a wafer (Block 302). As shown in FIGS. 8 through 10, the substrate 402 of the wafer may comprise n-type silicon (e.g., silicon doped with a group V element (e.g., phosphorus, arsenic, antimony, etc.) to furnish n-type charge carrier elements to the silicon) or p-type silicon (e.g., silicon doped with a group IIIA element (e.g., boron, etc.) to furnish p-type charge carrier elements to the silicon). Thus, the substrate 402 furnishes a base material utilized to form the photodetectors 408, the infrared photodetector 420, the clear photodetector 422, the dark current sensor (not shown in FIGS. 8 through 10), and the bond pad 426. The photodetectors 408 may comprise photodiodes, phototransistors, or the like, formed in the substrate of the wafer using suitable fabrication techniques such as photolithography, ion implantation, deposition, etching, and so forth.

One or more color pass filters are formed over a surface of the substrate (Block 304). The one or more color pass filters are configured to filter visible light to pass light in a limited spectrum of wavelengths to the one or more photodetectors. In various implementations, the color pass filters may be formed over an adhesion layer that is configured to adhere the color pass filters to the surface on which they are formed (Block 306). In implementation, the color pass filters 410 may be aligned with a respective photodetector 408 to filter light received by that color pass filter 410 as illustrated in FIG. 9. When formed, the color pass filters 410 may have a thickness of approximately one (1) micron. However, it is contemplated that color pass filters 410 having lesser or greater thicknesses are possible.

A buffer layer is formed over the color pass filters (Block 308). In an implementation, as illustrated in FIG. 10, the buffer layer is formed such that the buffer layer at least substantially encloses the color pass filters (Block 310) using a suitable deposition technique. In an implementation, the buffer layer 414 may be comprised of a polymer layer (e.g., a BCB polymer, or the like) and is configured to at least substantially encapsulate the color pass filters 410.

In an implementation, IR suppression filter is formed on a transparent substrate (Block 312) that is configured to facilitate formation of the IR suppression filter as well as furnishing support to the IR suppression filter. The IR suppression filter may be deposited over the transparent substrate (Block 314). In an example implementation, the IR suppression filter may comprise a multi-layer structure that includes at least two (2) different materials that comprise different refractive indices. In such implementations, the various materials of the IR suppression filter 416 may be formed on the transparent substrate 418 via various deposition techniques (e.g., sputtering) as shown in FIG. 10. However, it is contemplated that other techniques may be employed, including, but not limited to: chemical vapor deposition (CVD), electrochemical deposition (ECD), molecular beam epitaxy (MBE), and atomic layer deposition (ALD). When formed, the IR suppression filter 416 may be approximately one (1) to approximately fifteen (15) microns thick and/or approximately ten (10) to approximately one hundred and twenty (120) layers thick. However, it is contemplated that the IR suppression filter 416 may have other constructions and/or thicknesses. In an implementation, the transparent substrate 418 includes one or more apertures such that when the IR suppression filter 416 is formed on the transparent substrate 418, and the IR suppression filter 416 includes one or more apertures aligned with the apertures of the transparent substrate 418. The sensor 400 may also include dark edges (as described above and shown in FIG. 1D). In one or more implementations, the dark edges may be formed over the buffer layer 414, over the IR suppression filter 416, or over the transparent substrate 418 to at least substantially eliminate impingement of light that does not pass through the IR suppression filter 416.

Once the IR suppression filter is formed on the transparent substrate, the IR suppression filter and the transparent substrate are positioned over the buffer layer (Block 316). Once positioned, the IR suppression filter is bonded to the buffer layer (Block 318) which is used to adhere the transparent substrate and the silicon substrate together and to hold the transparent substrate in the desired position. The transparent substrate 418 and the IR suppression filter 416 are positioned over the buffer layer 414 such that the transparent substrate 418 and the IR suppression filter 416 at least substantially cover the color pass filters 410 and the photodetectors 408, 422.

FIG. 11 depicts a process 500, in an example implementation, for fabricating a light sensor, such as the example light sensors 100 illustrated in FIGS. 1B and 2B. As illustrated, one or more photodetectors are formed in a substrate of a wafer (Block 502). Then, one or more color pass filters are formed over a surface of the substrate (Block 504). As illustrated in FIGS. 1B and 2B, the color pass filters 110 are aligned with a respective photodetector 108. A first buffer layer is then formed over the color pass filters (Block 506). An IR suppression filter is formed over the first buffer layer (Block 508), and then a second buffer layer is formed over the IR suppression filter (Block 510). Next, a third buffer layer is formed over a transparent substrate (Block 512). The transparent substrate is positioned over the IR suppression filter so that the transparent substrate can be bonded to the substrate with the third buffer layer (Block 514). The third buffer layer may be utilized to adhere the transparent substrate to the silicon substrate (e.g., the wafer). For example, the third buffer layer is bonded to the second buffer layer that is formed over the IR suppression filter.

FIG. 12 illustrates an example process 600 for fabricating the light sensors, such as the light sensor 200 shown in FIG. 12. FIGS. 13 through 27 illustrate sections of example substrates (e.g., wafer sections) that may be utilized to fabricate light sensors 700 (such as sensor 200) shown in FIG. 4. A wafer, such as the silicon wafer 702 shown in FIG. 13, includes a first surface 704 and a second surface 706. One or more integrated circuits (not shown) and one or more photodetectors 708 are formed in the wafer 702 proximate to the first surface 704. The integrated circuits are configured to perform multiple functions based upon the input (e.g., signals) to the circuits. The photodetector(s) 708 is configured to detect light (e.g., visible and infrared) and generate a signal in response thereto. The photodetector 708 may be implemented as a photo sensor diode, a phototransistor, and so forth.

As shown in FIG. 14, an interlayer-dielectric (ILD) layer is formed over the wafer (Block 602). For example, an interlayer-dielectric layer 709 may be deposited over the first surface 704 with one or more suitable deposition techniques. The interlayer-dielectric material 709 may be a low-k material, and so forth. In one or more implementations, the material 709 may be about 1 micron to about 1.3 microns in thickness. A metal layer is then formed over the interlayer-dielectric layer (Block 604). The metal layer 710 illustrated in FIG. 14 may be a metal one layer (e.g., aluminum), or the like. Forming of the metal layer may include depositing the metal layer 710 over the layer 709 with suitable deposition techniques and then patterning the metal layer 710 to form one or more conductive layers 712, as well as alignment marks 714. A passivation layer is then formed (e.g., deposited) over the patterned metal layers and the ILD layer(s) (Block 606). The passivation layer 716 illustrated in FIG. 15 may be an oxide layer, or the like. In one or more implementations, the passivation layer 716 may insulate the metal layers 710 (e.g., conductive layers 712, alignment marks 714) from later fabrication steps.

Figure 15:
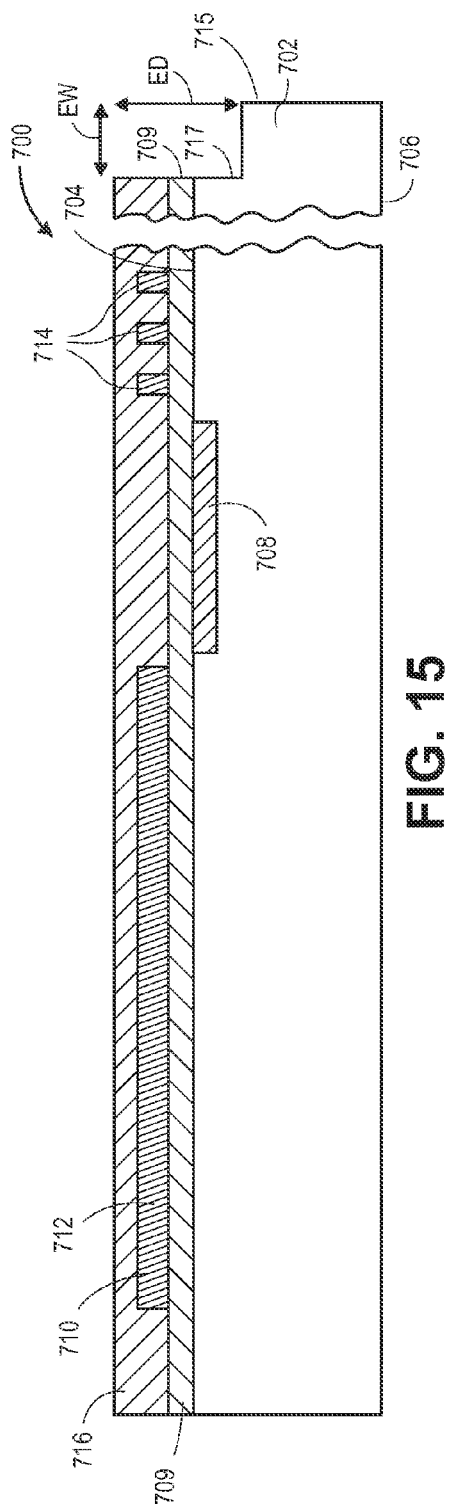
Figure 16:
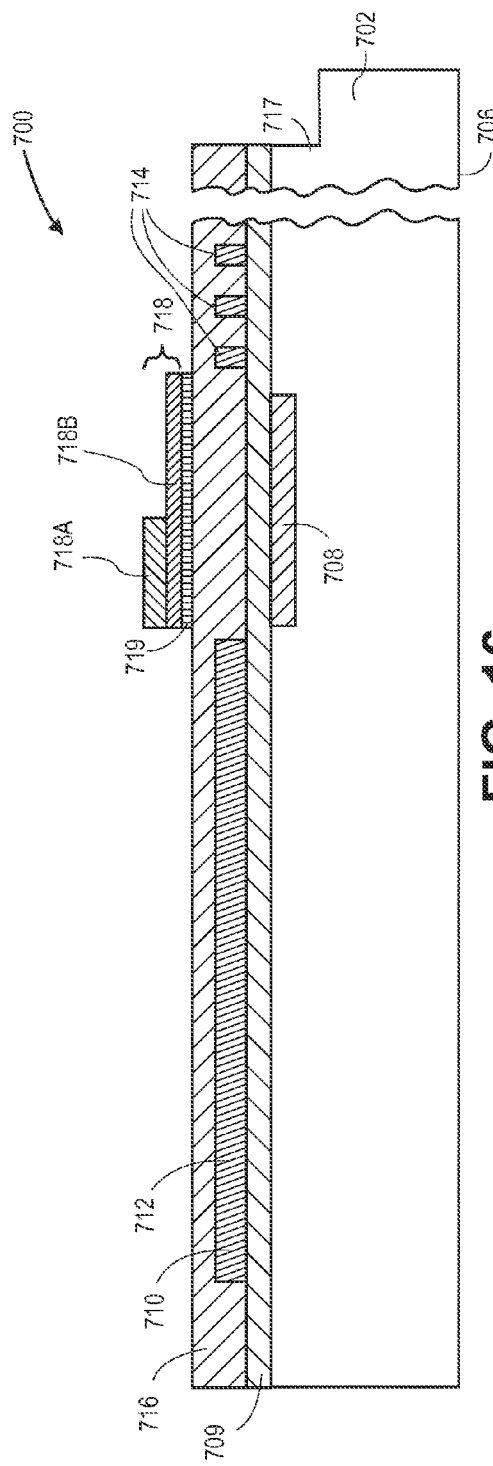
Figure 17:
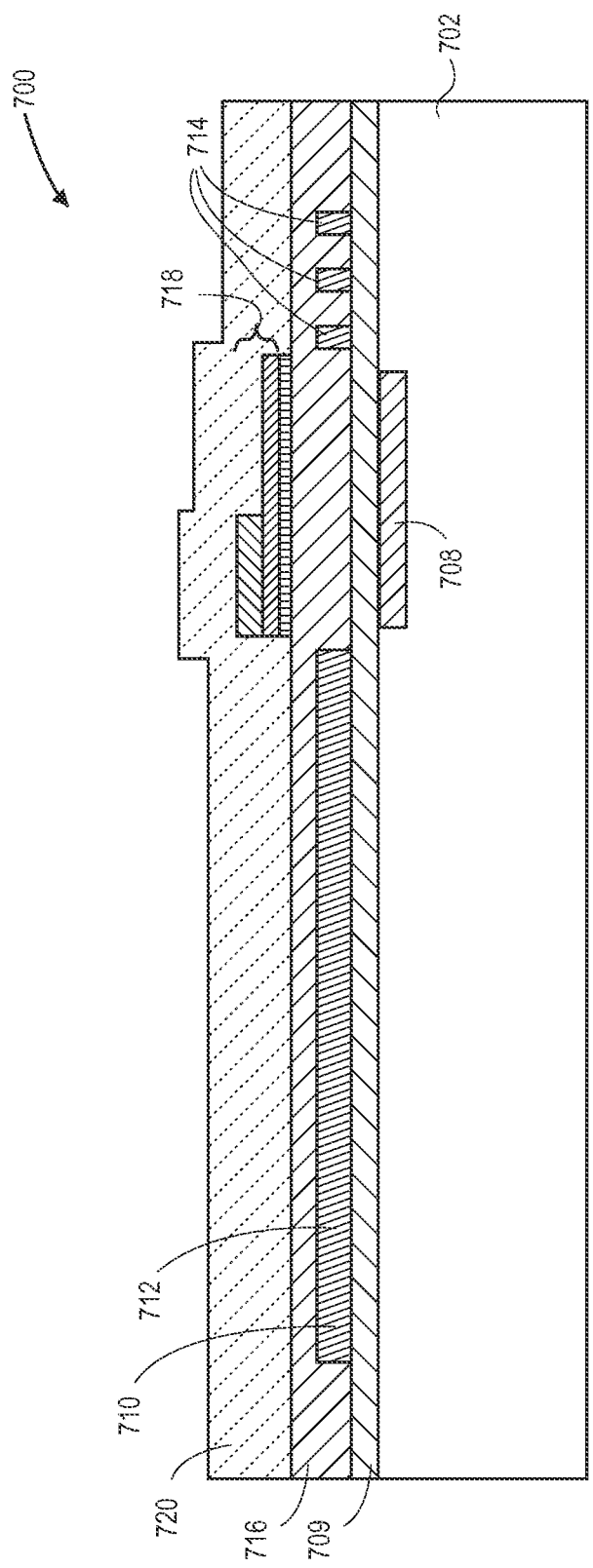
Figure 18:
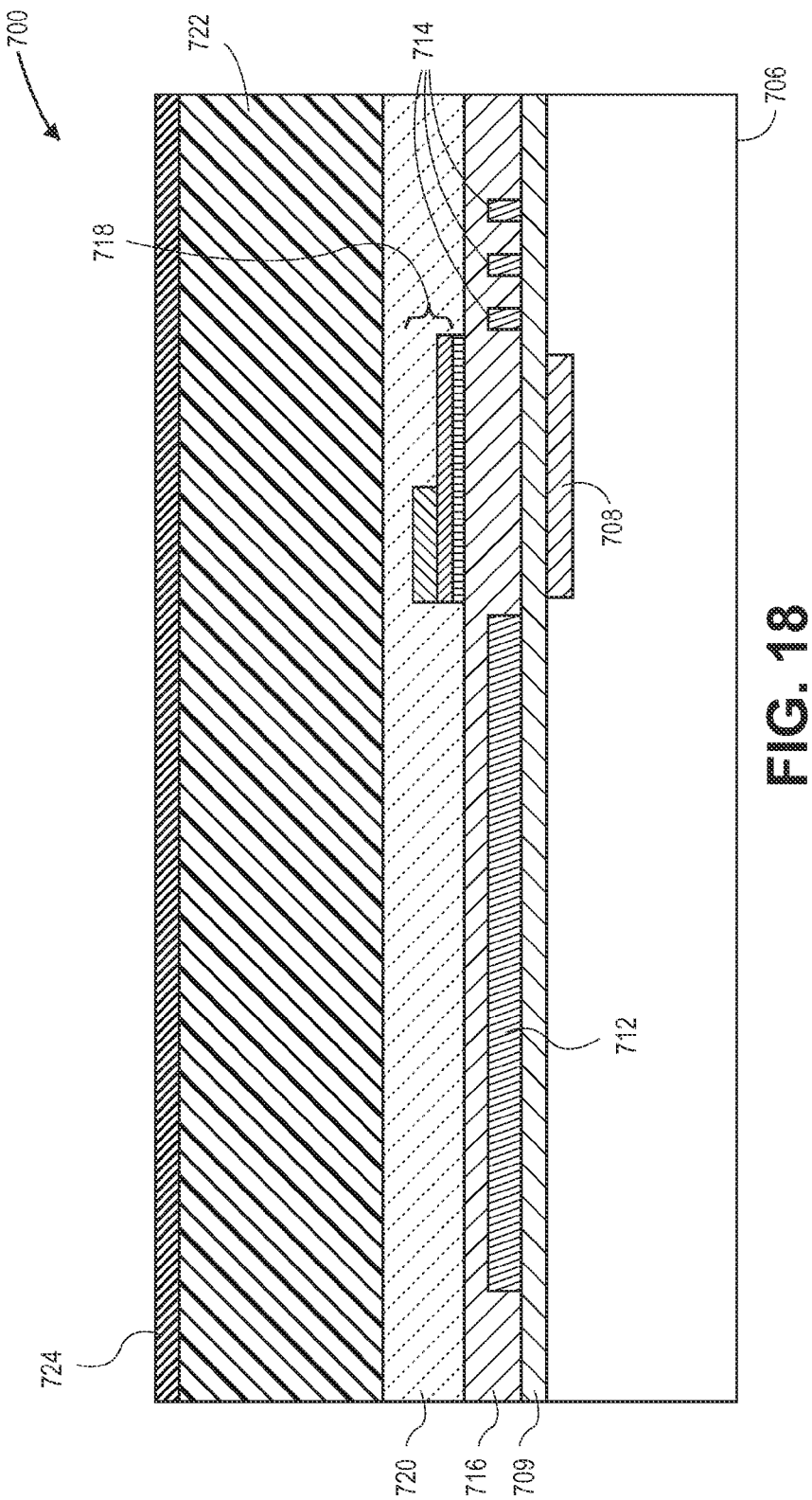
Figure 19:
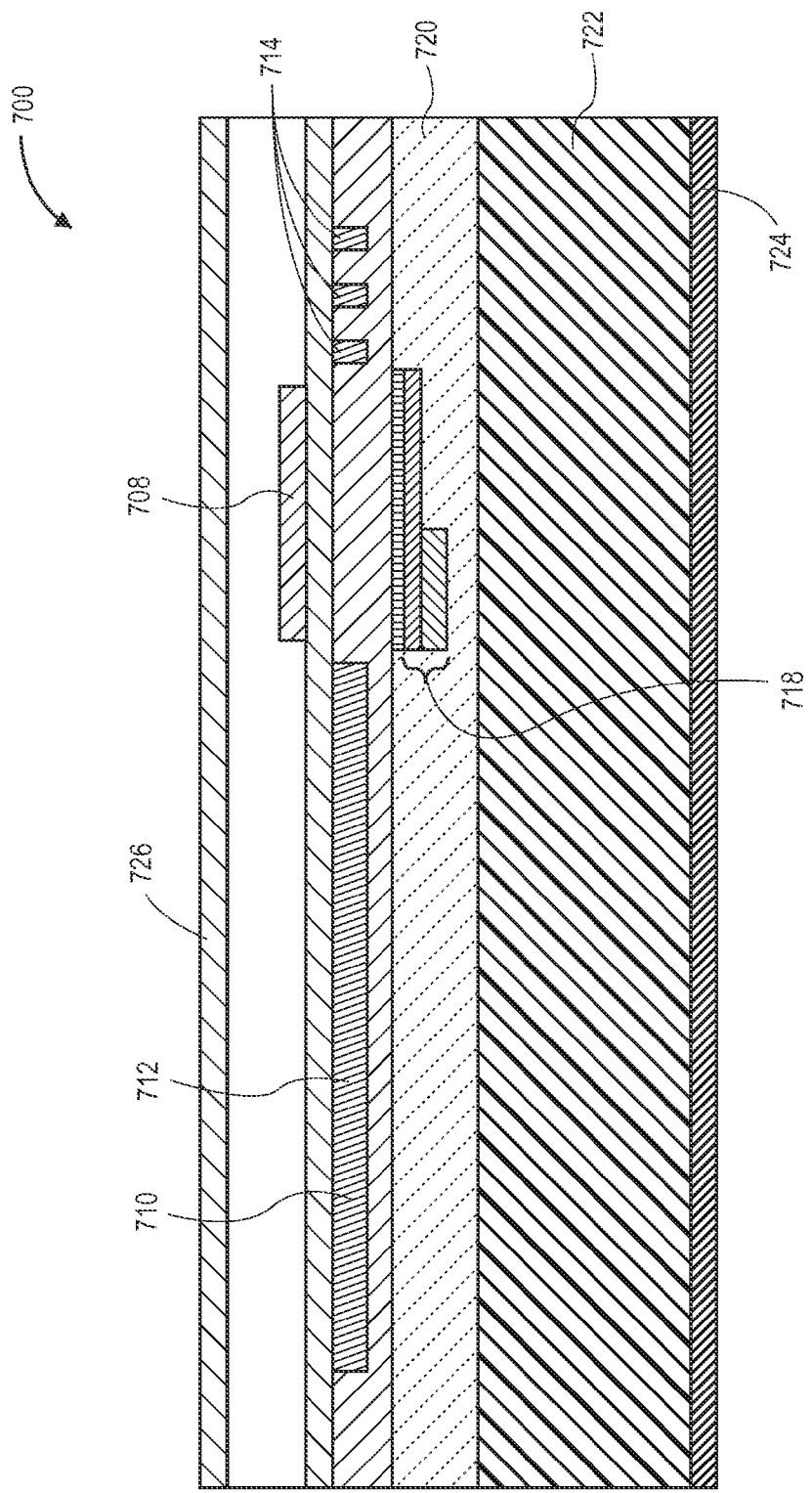

As shown in FIG. 15, an edge trim region 717 is formed about the edge 715 of the wafer 702 through suitable etching techniques. The edge trim region 717 may be comprised of various dimensions depending upon the requirements of the wafer 702 (e.g., attaching the transparent substrate). In a specific example, the edge trim region 717 may have a depth ("ED") of about one hundred and fifty microns (150 µm) and a width of approximately five millimeters (5 mm). However, the edge trim region 717 may have other dimensions depending upon the fabrication requirements of the wafer 702. For example, the depth of the edge trim region 717 may be less than one hundred and fifty microns (150 µm) in some implementations or greater than one hundred and fifty microns (150 µm) in other implementations. In another example, the width of the edge trim region 717 may be less than five millimeters (5 mm) in some implementations or greater than five millimeters (5 mm) in other implementations. One or more color filters are then formed over the passivation layer and over the adhesion layer (Block 608). As described above, the color filters 718 allow light in a limited spectrum of wavelengths to pass through the filter, while blocking (e.g., reflecting or absorbing) light within a second spectrum of wavelengths. In one or more implementations, the color filters 718 are configured as absorption filters. As shown in FIG. 16, the color filters may be a red color filter 718A or a green color filter 718B formed over the photodetector 708. The color filters 718 are held at least substantially in position with a suitable adhesive (e.g., bonding) material 719. While FIG. 16 only illustrates red and green color filters, it is contemplated that other color filters may be employed (e.g., blue, magenta, cyan, etc.) depending on the requirements of the sensors 700. Moreover, while the color filters 718A and 718B are shown stacked upon each other, it is understood that individual color filters 718 may be deployed over the passivation layer 716 and over individual photodetectors 708 (e.g., a single color filter 718 deployed over a single photodetector 708) in a non-stacked configuration.

An adhesive material is then formed over the passivation layer, the adhesion layer, and the color filters (Block 610) for permanent bonding. The adhesive material 720 shown in FIG. 17 may be a benzocyclobutene (BCB) material, an epoxy material, or the like. In one or more implementations, the adhesive material 720 is configured to at least substantially pass light through the material 720. A transparent substrate is then bonded to the wafer with the adhesive material (Block 612). In one or more implementations, the transparent substrate 722 (see FIG. 18) may be a glass wafer, or the like. The transparent substrate 722 may include a protective layer 724 to protect the transparent substrate 722 from later fabrication steps. Moreover, the transparent substrate 722 may further include a standoff layer (not shown) that is configured to protect a lens (described herein) from pressure exerted on a transparent substrate 722 surface proximate to the lens. The substrate 722 is also configured to at least substantially pass light incident upon the substrate 722. As shown in FIG. 12, the silicon wafer is subjected to a backgrinding process and then re-oriented (Block 614). The second surface 706 of the wafer 702 is subjected to a backgrinding process (see FIG. 19) with any suitable backgrinding techniques (e.g., chemical-mechanical planarization, etc.). The alignment marks 714 may be used to properly align the wafer 702 with the transparent substrate 722 through one or more suitable alignment techniques. The sensor 700 is re-oriented so that the transparent substrate 722 is oriented to the bottom with respect to the wafer 702 for further fabrication steps. Once the silicon wafer is re-oriented, an oxide layer is deposited over the second surface (Block 616). In one or more implementations, the oxide layer 726 may be a silicon dioxide layer, or the like, that forms a hardmask region (see FIG. 20).

Figure 20:
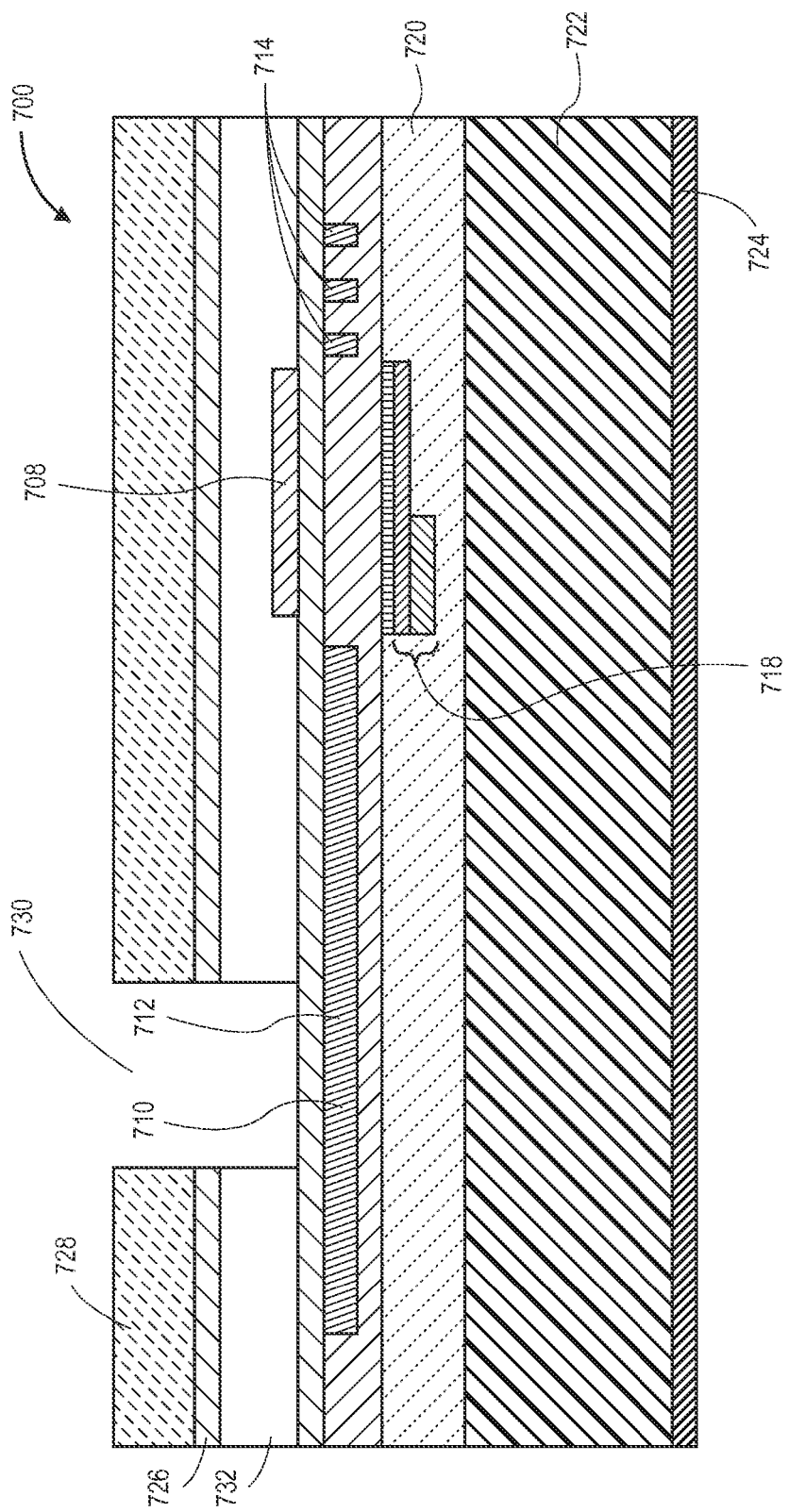
Figure 21:
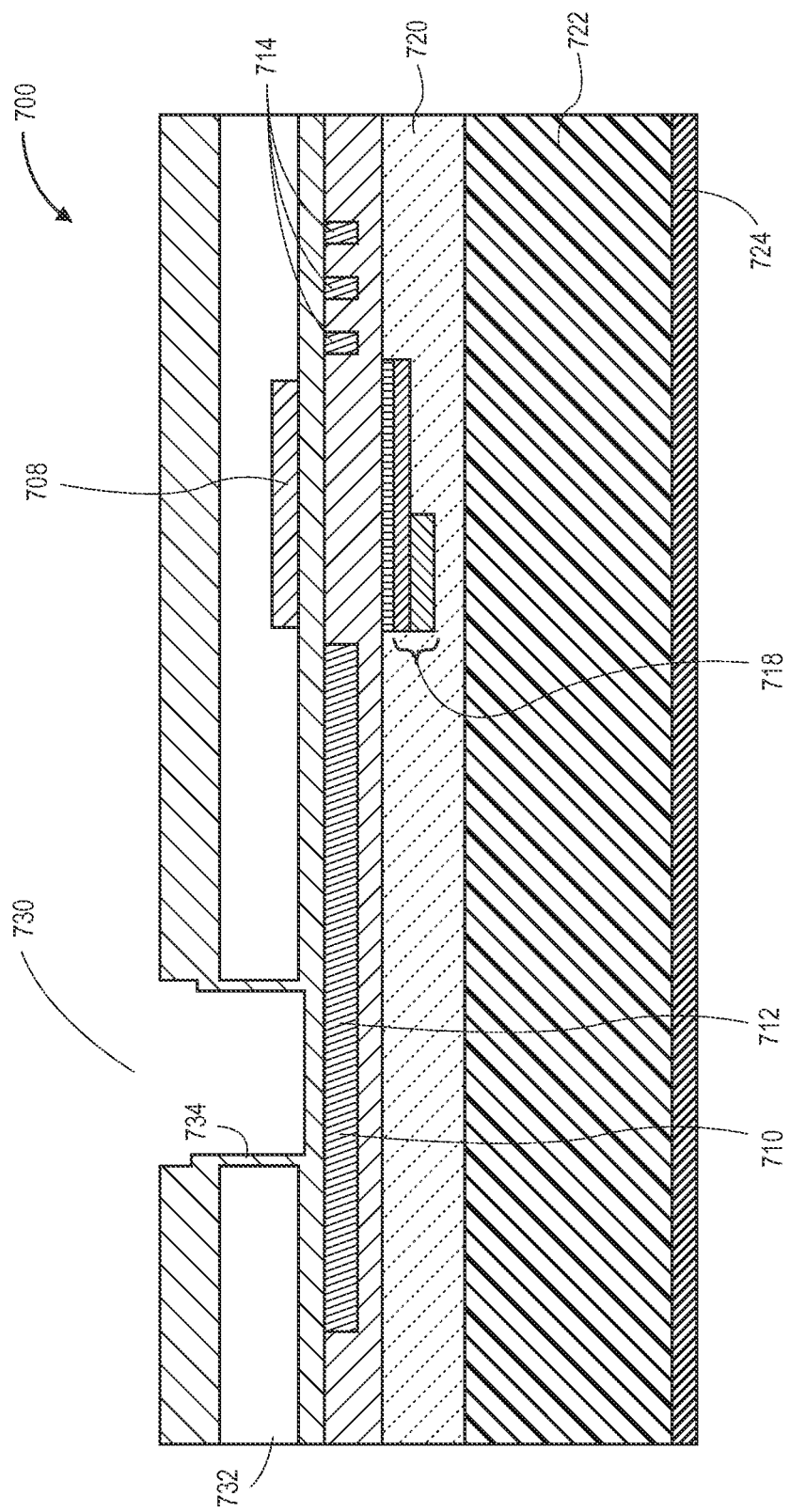

A through-substrate via (TSV) is then formed in the wafer (Block 616). As shown in FIG. 20, a photoresist layer 728 is first deposited over the oxide layer 726 to allow for patterning of the TSV 730. A selected region of the photoresist layer 728 is patterned to allow for etching of the TSV 730. The selected region is then etched through the silicon region 732 to form the TSV 730. As described above with respect to FIG. 4, the TSV 730 allows for electrical interconnects to be formed in the light sensor 700. The photoresist layer 728 is then removed through one or more suitable stripping techniques. Once the photoresist layer 728 is removed, a liner material 734 may be deposited over the light sensor 700 and in the TSV 730 (see FIG. 21). In one or more implementations, the liner material 734 may be a suitable liner material, such as a silicon dioxide material, a nitride passivation material, or an organic polymer. A spacer etch may be performed to etch any unwanted liner material 734. For example, the spacer etch may remove liner material 734 to at least partially expose the conductive layer 712A (e.g., contact pad). As shown in FIG. 12, an isolation material is then deposited in the through-substrate via (Block 618).

Figure 22:
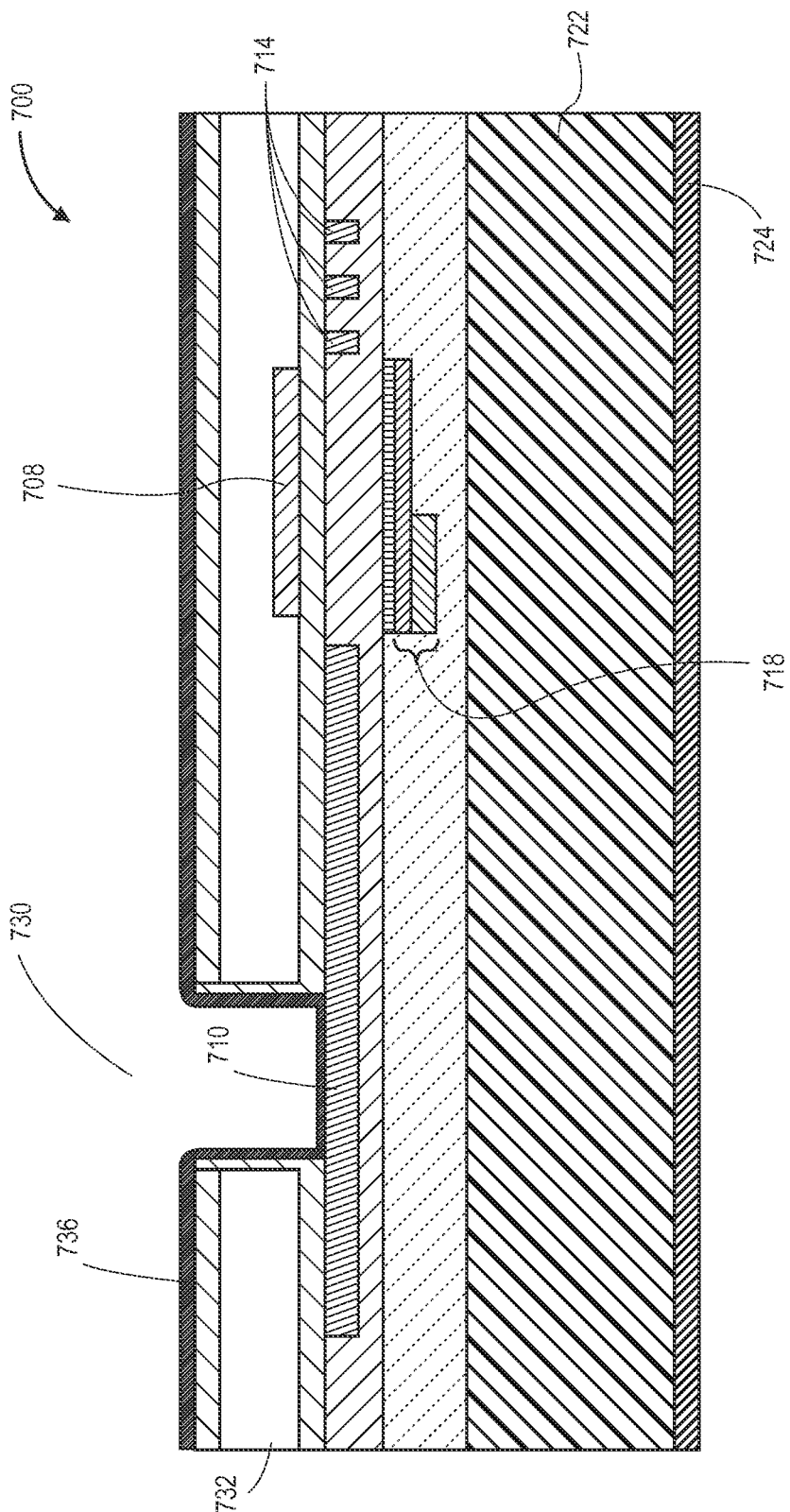
Figure 23:
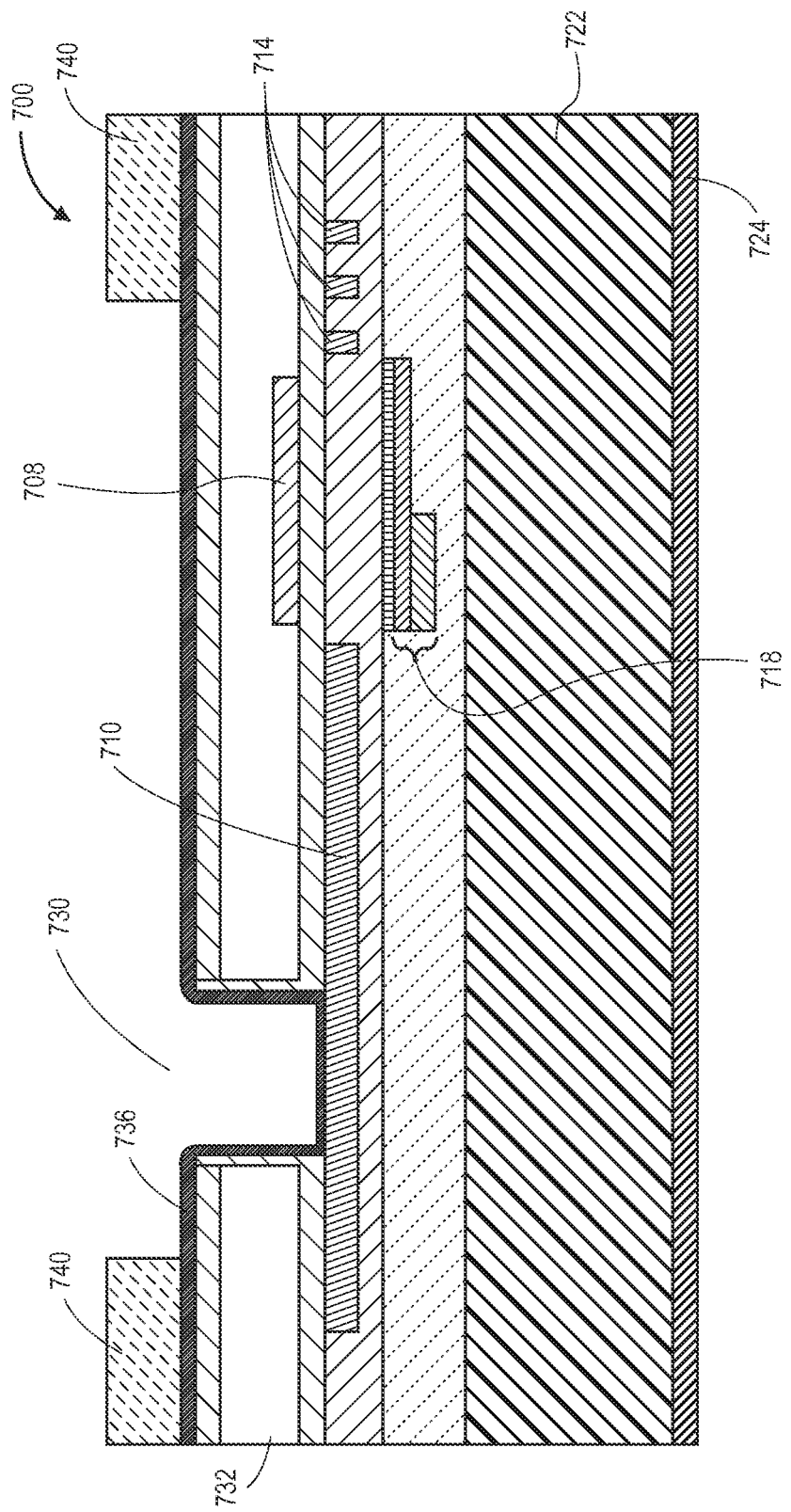
Figure 24:
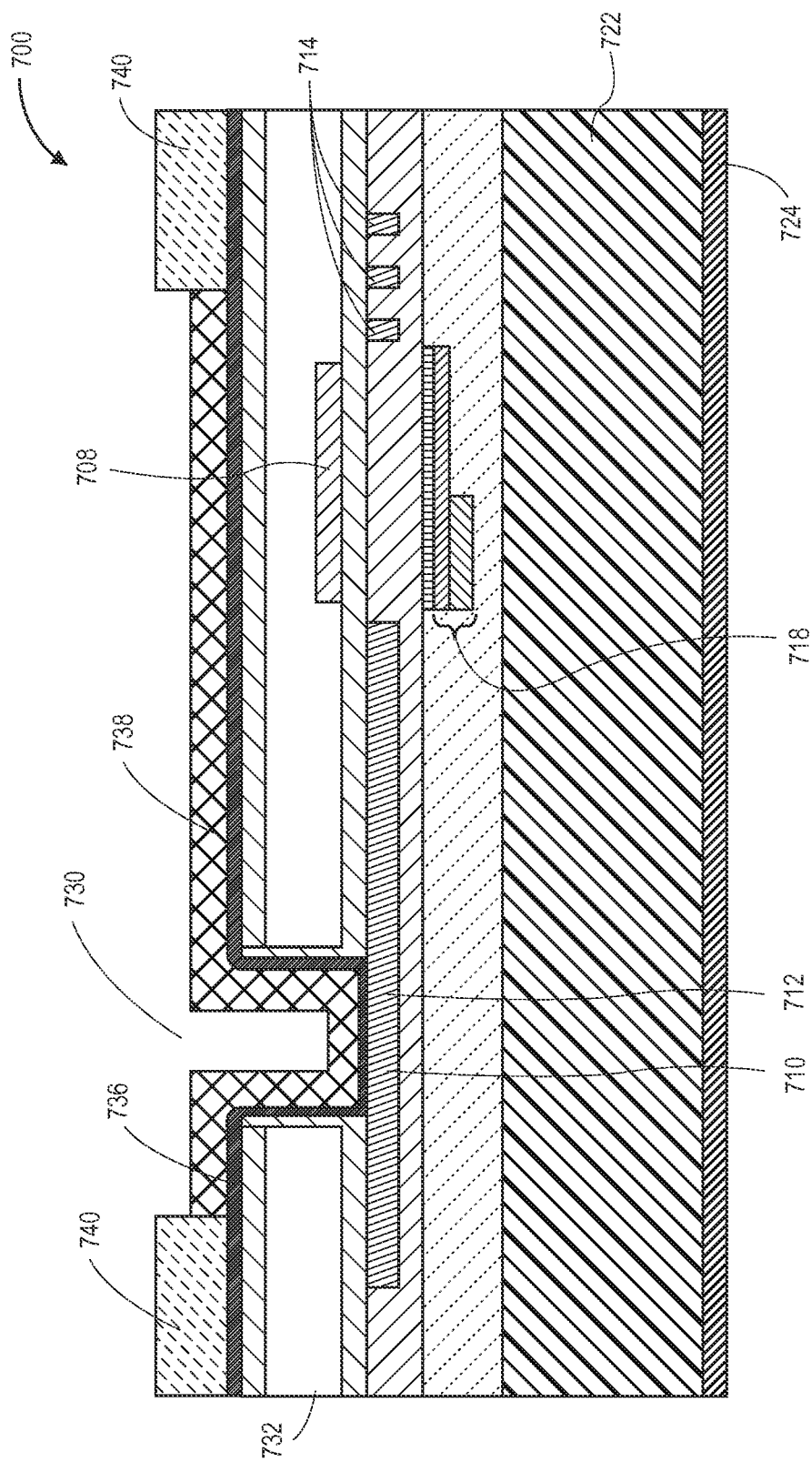

A conductive material is then deposited in the TSV (Block 620) to form an electrical interconnect. For example, as shown in FIG. 22, a barrier and seed metal 736 is deposited in the TSV 730 and over the sensor 700. The barrier and seed metal 736 may then be patterned through photolithography, or the like. A conductive material 738 is then plated over the seed metal 736 to form the electrical interconnections in the TSV 730 (see FIG. 24). In one or more implementations, the conductive material 738 may be copper, or the like. Moreover, the conductive material 738 may have a thickness of approximately six (6) microns. As shown in FIGS. 23 and 24, a resist mask 740 is also formed (e.g., deposited) to prevent formation of the conductive material 738 in the mask 740 regions. In one or more implementations, the resist mask 740 may be comprised of a negative resist material, or the like.

Figure 25:
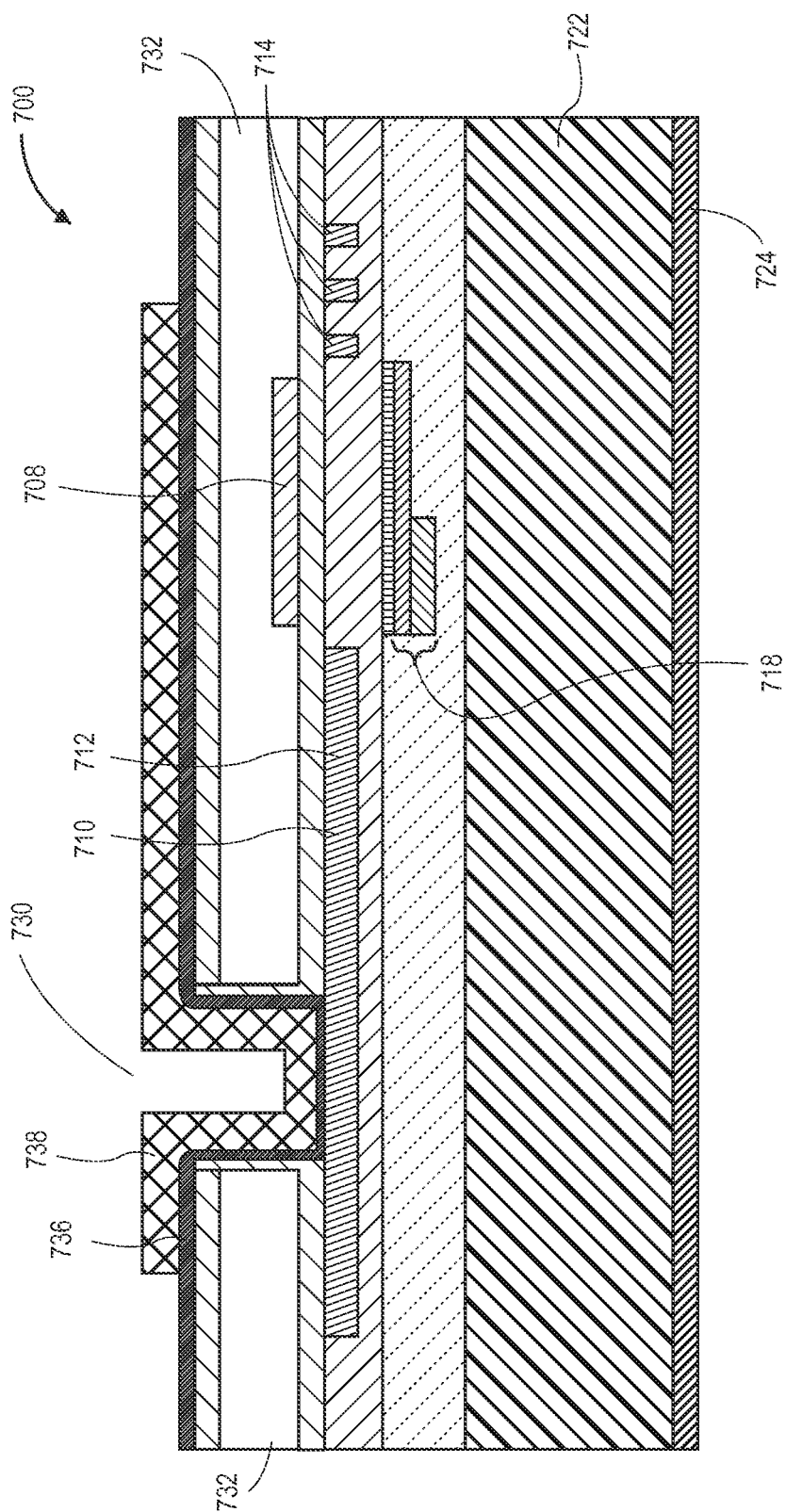
Figure 26:
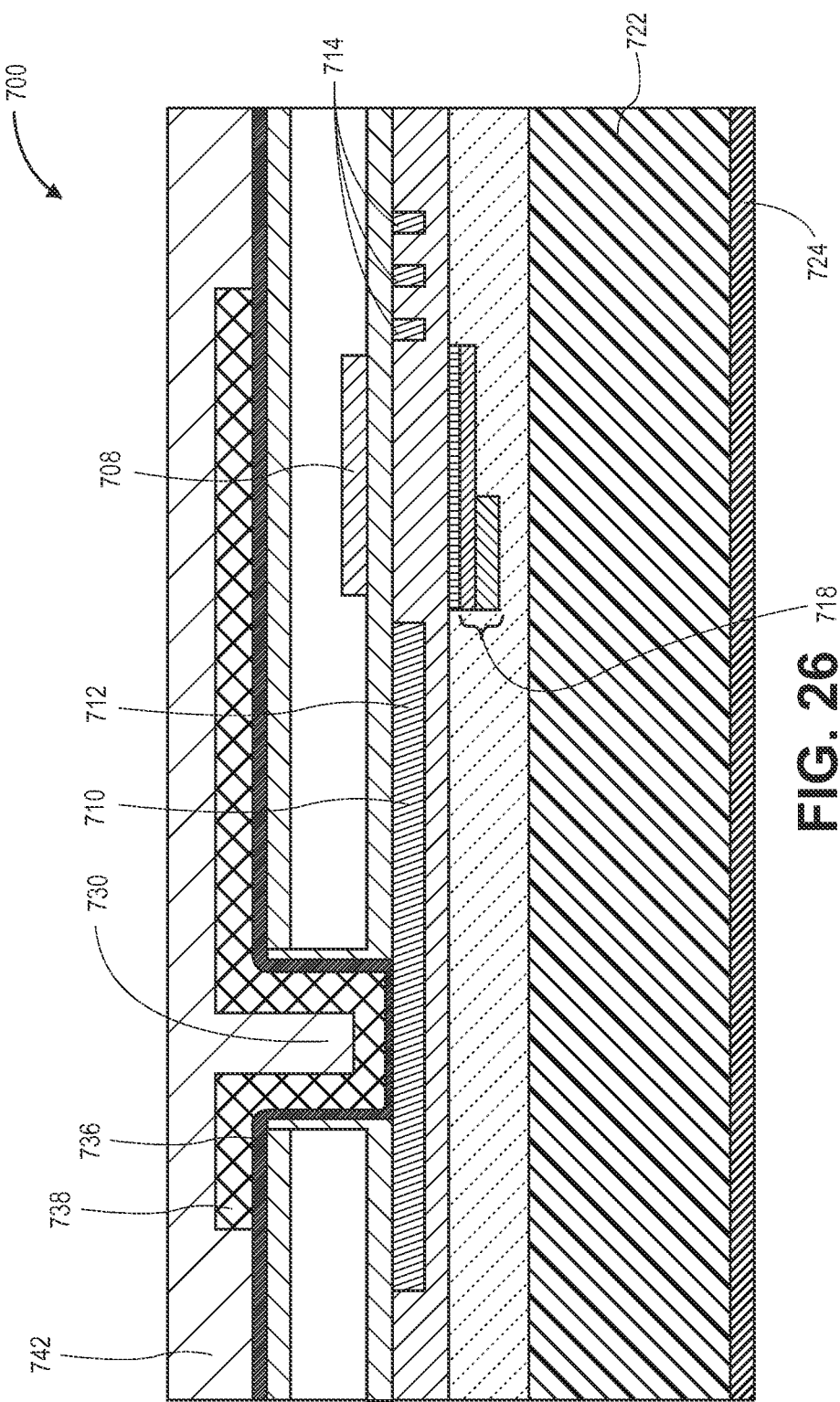
Figure 27:
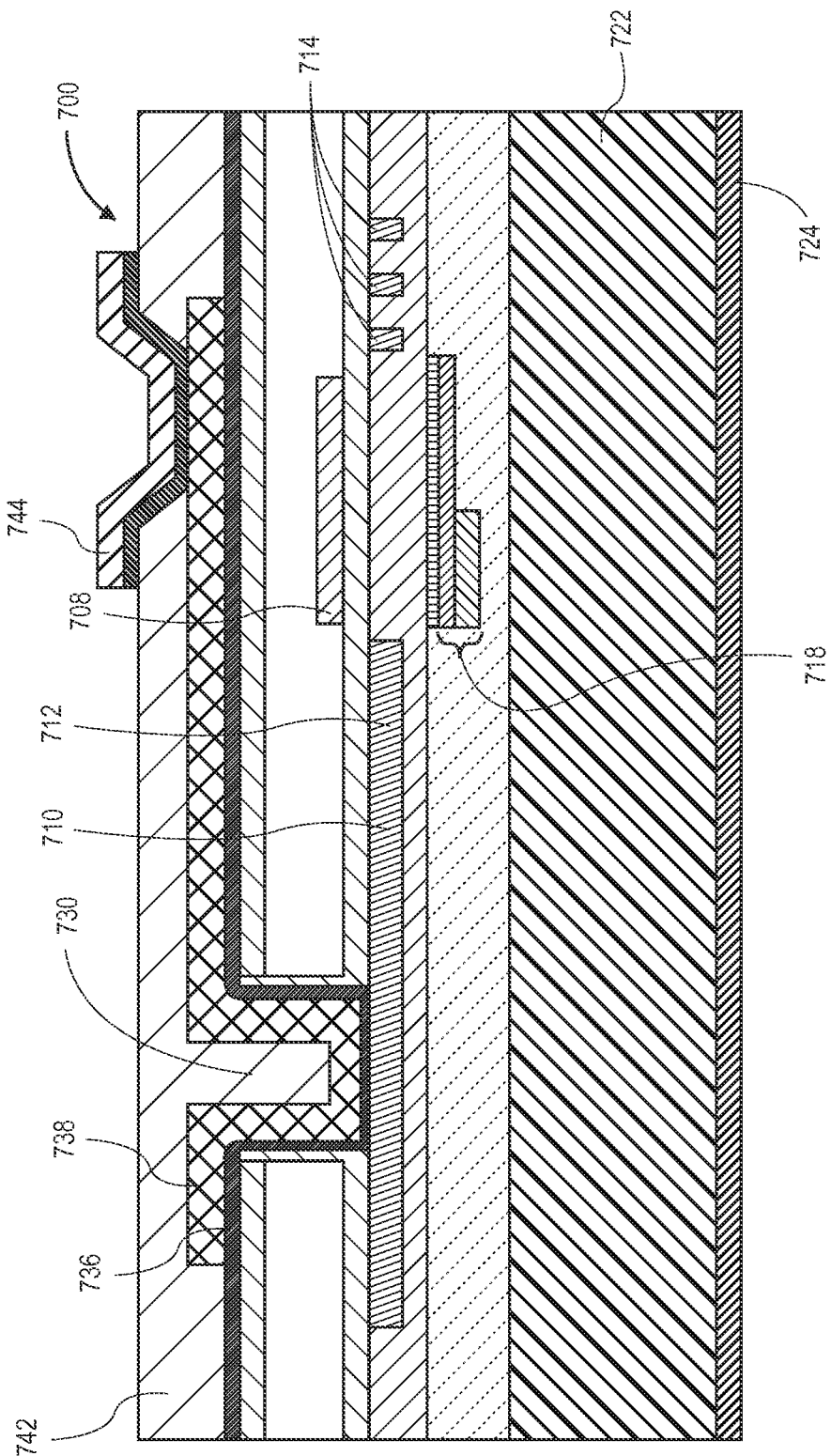

The under-bump metallization region is then formed over the wafer (Block 620). Referring to FIGS. 25 and 26, the mask 740 and the seed metal 736 under the mask 740 are stripped away. The seed metal 736 and the mask region 740 may be stripped away with one or more suitable etching techniques. For example, the etching techniques may include a wet etch, or the like. A passivation layer 742 may then be formed over the wafer 702 (e.g., over the conductive material 738) to insulate the conductive material 738 from the later fabrication steps. The passivation layer 742 may be comprised of a BCB material, a polyimide layer, or the like. As shown in FIG. 27, the UBM region 744 is formed over the conductive material 738. For example, the passivation layer 742 is selectively etched and then a UBM conductive material 746 is deposited over the recently etched passivation layer 742 area for formation of the UMB region 744. A solder bump is subjected to a reflow process to the UBM region 744 to provide an electrical interconnect between the sensor 700 and a corresponding PCB pad. It is further contemplated that the transparent substrate 722 includes a lens as described above and shown in FIGS. 4 through 6. The lens may be a Fresnel lens, a ball lens, a diffractive lens, or another type of lens that may be preformed in the transparent substrate 724 or formed after formation of the UBM region 744. Moreover, the transparent substrate 724 may include a diffuser in addition to or in place of the lens. Suitable wafer-level packaging processes may be utilized to segment and package the wafer 702 into individual die.

Conclusion

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A light sensor comprising:
    a substrate having a surface;
    a photodetector formed in the substrate proximate to the surface, the photodetector configured to detect light generated from a single illumination source and to provide a signal in response thereto;
    a first color filter disposed over the photodetector and configured to filter light in a first limited spectrum of wavelengths to the photodetector;
    a second color filter disposed over the photodetector and configured to filter light in a second limited spectrum of wavelengths to the photodetector;
    a third color filter disposed over the photodetector and configured to filter light in a third limited spectrum of wavelengths to the photodetector;
    a transparent substrate disposed over the substrate, the transparent substrate including a lens configured to collimate light incident on the lens and to pass the collimated light to at least one of the first color filter, the second color filter, or the third color filter, and
    an IR suppression filter disposed between at least one of the first color filter, the second color filter, or the third color filter and the transparent substrate, the IR suppression filter configured to filter infrared light to at least substantially block infrared light from reaching the least one of the first color filter, the second color filter, or the third color filter.

2. The light sensor as recited in claim 1, further comprising a first conductive layer and a second conductive layer and a through-substrate via configured to provide an electrical interconnect with the photodetector.

3. The light sensor as recited in claim 1, wherein the photodetector comprise at least one of photodiodes or phototransistors.

4. The light sensor as recited in claim 1, wherein the first color filter is stacked over or adjacent to the second color filter, and the second color filter is stacked over or adjacent to the third color filter.

5. The light sensor as recited in claim 1, wherein the lens is configured as at least one of a Fresnel lens, a ball lens, a diffractive lens, a diffractive optics element, or a gradient-index optics lens.

6. The light sensor as recited in claim 1, wherein the transparent substrate comprises a glass substrate.

7. The light sensor as recited in claim 1, wherein the second color filter is disposed over the first color filter in a stacked configuration.

8. The light sensor as recited in claim 7, wherein the third color filter is disposed over the second color filter in a stacked configuration.

9. The light sensor as recited in claim 1, wherein the lens is disposed directly over at least one of the first color filter, the second color filter, or the third color filter.

10. A process comprising:
    forming one or more color filters over a passivation layer of a wafer, the passivation layer formed over a surface of the wafer, the wafer including at least one photodetector formed therein, the at least one photodetector configured to detect light generated from a single illumination source and to provide a signal in response thereto, the one or more color filters disposed over the photodetector, the one or more color filters configured to pass light in a limited spectrum of wavelengths to the photodetector;
    forming an adhesive material over the passivation layer and the one or more color filters;
    forming an IR suppression filter over the one or more color filters, the IR suppression filter configured to filter infrared light to at least substantially block infrared light from reaching the at least one color filter;
    positioning a transparent substrate over the wafer, the transparent substrate including a lens configured to collimate light incident on the lens, the IR suppression filter disposed between the at least one color filter and the transparent substrate; and
    forming a through-substrate via in the wafer to provide an electrical interconnect with the at least one photodetector.

11. The process as recited in claim 10, wherein forming one or more color filters further comprises forming a first color filter over or adjacent to a second color filter, wherein the second color filter is formed over or adjacent to a third color filter.

12. The process as recited in claim 11, wherein the first color filter is configured to filter light in a first limited spectrum of wavelengths to a photodetector formed in the wafer, the second filter is configured to filter light in a second limited spectrum of wavelengths to the photodetector, and the third color filter is configured to filter light in a third limited spectrum of wavelengths to the photodetector.

13. The process as recited in claim 10, further comprising forming an edge trim region about an edge of the substrate.

14. The process as recited in claim 10, wherein forming a through-silicon via further comprises forming a hardmask layer over the wafer, depositing a photoresist layer over the hardmask layer, patterning a selected region of the photoresist layer, etching the selected region to form the through-silicon via.

15. The process as recited in claim 10, wherein the one or more color filters comprise a color absorption filter.

16. The process as recited in claim 10, wherein the lens is configured as at least one of a Fresnel lens, a ball lens, a diffractive lens, a diffractive optics element, or a gradient-index optics lens.

* * * * *